(12) United States Patent
Hatakeyama et al.

(10) Patent No.: US 6,673,511 B1
(45) Date of Patent: Jan. 6, 2004

(54) RESIST COMPOSITION

(75) Inventors: Jun Hatakeyama, Niigata-ken (JP); Youichi Ohsawa, Niigata-ken (JP); Takeru Watanabe, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 246 days.

(21) Appl. No.: 09/697,921

(22) Filed: Oct. 27, 2000

(30) Foreign Application Priority Data

Oct. 29, 1999 (JP) .......................................... 11/308496

(51) Int. Cl.⁷ .............................................. G03F 7/004
(52) U.S. Cl. ..................... 430/270.1; 430/325; 430/326
(58) Field of Search ............... 430/270.1, 326, 430/325

(56) References Cited

U.S. PATENT DOCUMENTS

| | | | |
|---|---|---|---|
| 4,491,628 A | 1/1985 | Ito et al. ...................... | 430/176 |
| 5,442,087 A | 8/1995 | Eichhorn et al. .............. | 560/12 |
| 5,529,886 A | 6/1996 | Eichhorn et al. ........ | 430/270.1 |
| 5,612,169 A | 3/1997 | Eichhorn et al. ........ | 430/270.1 |
| 5,741,621 A * | 4/1998 | Kempf et al. ................ | 430/253 |
| 5,968,712 A | 10/1999 | Thackeray et al. ......... | 430/326 |
| 6,274,286 B1 * | 8/2001 | Hatakeyama et al. | |

FOREIGN PATENT DOCUMENTS

| | | | | |
|---|---|---|---|---|
| JP | 05158239 A | 6/1993 | ........... | G03F/7/038 |
| JP | 05232706 A | 9/1993 | ........... | G03F/7/039 |
| JP | 05249683 A | 9/1993 | ........... | G03F/7/039 |
| JP | 05257282 A | 10/1993 | ........... | G03F/7/038 |
| JP | 05289322 A | 11/1993 | ........... | G03F/7/004 |
| JP | 05289340 A | 11/1993 | ........... | G03F/7/039 |

(List continued on next page.)

OTHER PUBLICATIONS

Hinsberg et al.; "Fundamental Studies of Airborne Chemical Contamination of Chemically Amplified Resists," *Journal of Photopolymer Science and Technology* 6:4 535–546 (1993).

(List continued on next page.)

*Primary Examiner*—Rosemary Ashton
(74) *Attorney, Agent, or Firm*—Myers Bigel Sibley & Sajovec, PA

(57) ABSTRACT

Although use of a nitrogen-containing compound as a basic compound component of a resist composition makes it possible to ease the T-top problem at an acid dissociation constant pKa falling within a range of 2 to 6, it is accompanied with the problem that the reaction, that is, acid diffusion upon use of a highly-reactive acid-labile group cannot be controlled. In order to overcome this problem, one or more basic compounds selected from those represented by the following formulas (I) to (III) and (1) to (4) are employed.

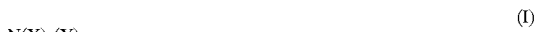

(I)

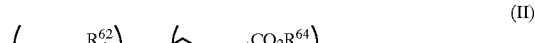

(II)

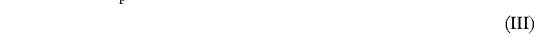

(III)

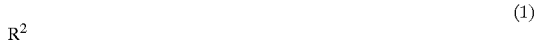

(1)

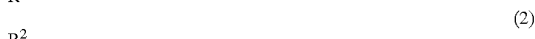

(2)

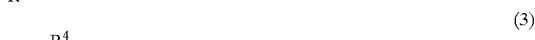

(3)

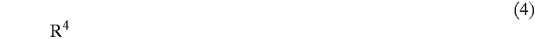

(4)

9 Claims, No Drawings

FOREIGN PATENT DOCUMENTS

| | | | | |
|---|---|---|---|---|
| JP | 06194834 A | 7/1994 | ........... | G03F/7/028 |
| JP | 06242605 A | 9/1994 | ........... | G03F/7/039 |
| JP | 06242606 A | 9/1994 | ........... | G03F/7/039 |
| JP | 06266100 A | 9/1994 | ........... | G03F/7/004 |
| JP | 06266111 A | 9/1994 | ........... | G03F/7/039 |
| JP | 07092678 A | 4/1995 | ........... | G03F/7/039 |
| JP | 07092680 A | 4/1995 | ........... | G03F/7/039 |
| JP | 07092681 A | 4/1995 | ........... | G03F/7/039 |
| JP | 07120929 A | 5/1995 | ........... | G03F/7/039 |
| JP | 07128859 A | 5/1995 | ........... | G03F/7/039 |
| JP | 07134419 A | 5/1995 | ........... | G03F/7/039 |

OTHER PUBLICATIONS

Kumada et al.; "Study on Over–Top Coating of Positive Chemical Amplification Resists for KrF Excimer Laser Lithography," *Journal of Photopolymer Science and Technology* 6:4 571–574 (1993).

U.S. patent application No. 06/873,914, Filed: Jun. 13, 1986., ABN.

\* cited by examiner

RESIST COMPOSITION

BACKGROUND OF THE INVENTION

1. Field of the Invention

The present invention relates to a novel, chemically amplified resist composition suited for use in microlithography.

2. Description of the Related Art

The miniaturization of a pattern rule has been demanded in order to cope with a recent tendency of LSI technology to higher integration and higher speed. Under such a circumstance, far ultraviolet lithography has been regarded promising as the next-generation of micro-lithography. Even a pattern of 0.3 µm or less can be formed by far ultraviolet lithography, and use of a resist material exhibiting low light absorption makes it possible to form a pattern with side-wall angles nearly vertical to a substrate. In recent years, a technique making use of a high intensity KrF excimer laser as a far-UV light source has drawn attentions. There is accordingly a demand for the development of a low light absorbing and highly sensitive resist material which permits the use of the above-described technique for mass production.

From such a viewpoint, the recently-developed, chemically amplified positive type resist materials as described in Japanese Patent Publication (JP-B) No. 2-27660/'90 and Japanese Patent Provisional Publication (JP-A) No. 63-27829/'88 using an acid catalyst are particularly promising resist materials suited for far-UV lithography, because of their excellent characteristics such as high sensitivity, resolution and dry etching resistance.

Prior-art chemically amplified resists are however accompanied with the problems such as PED (Post Exposure Delay) that line patterns have a T-top profile, in other words, patterns become thick at the top, when the dwelling time from exposure to PEB (post exposure bake) is extended; and a so-called "trailing phenomenon" that patterns in the vicinity of a basic substrate, particularly, a substrate made of silicon nitride or titanium nitride are widened.

It is presumed that the T-top profile results from lowering in the solubility of the surface of a resist film, while the trailing phenomenon on a substrate results from lowering in solubility in the vicinity of the substrate.

In addition, during the time from exposure to PEB, a dark reaction for eliminating an acid-labile group proceeds, leading to a problem that the leaving size of the line of a positive resist decreases.

These problems are serious hindrance to practical use of the chemically amplified resist. Such problems of the conventional chemically amplified positive resist material not only make difficult dimensional control upon lithography but also impair dimensional control upon processing of a substrate by using dry etching [refer to: W. Hinsberg, et al., J. Photopolym. Sci. Technol., 6(4), 535–546(1993) and T. Kumada, et al., J. Photopolym. Sci. Technol., 6(4), 571–574 (1993)].

It is understood that in these chemically amplified positive type resist materials, a basic compound in the air or on the surface of a substrate largely takes part in the problem of PED or trailing phenomenon on the substrate. An acid on the surface of a resist film generated by exposure to light reacts with a basic compound in the air and is thereby deactivated. The longer the dwelling time from exposure to PEB becomes, the more the amount of a deactivated acid increases, making it difficult to cause decomposition of an acid-labile group. An insolubilized layer is therefore formed on the surface and a pattern inevitably has a T-top configuration.

It is well known that addition of a basic compound is effective for overcoming PED, because it can suppress the influence of a basic compound in the air (as described in Japanese Patent Provisional Publication Nos. 5-232706/'93, 5-249683/'93, 5-158239/'93, 5-249662/'93, 5-257282/'93, 5-289322/'93, 5-289340/'93, 6-194834/'93, 6-242605/'94, 6-242606/'94, 6-263716/'94, 6-263717/'94, 6-266100/'94, 6-266111/'94, 7-128859/'95, 7-92678/'95, 7-92680/'95, 7-92681/'95, 7-120929/'95 and 7-134419/'95).

As the basic compound, a nitrogen-containing compound is well known and examples include amine compounds and amide compounds having a boiling point of 150° C. or greater. Specific examples include pyridine, polyvinyl pyridine, aniline, N-methylaniline, N,N-dimethylaniline, o-toluidine, m-toluidine, p-toluidine, 2,4-lutidine, quinoline, isoquinoline, formamide, N-methylformamide, N,N-dimethylformamide, acetamide, N-methylacetamide, N,N-dimethylacetamide, 2-pyrrolidone, N-methylpyrrolidone, imidazole, α-picoline, β-picoline, γ-picoline, o-aminobenzoic acid, m-aminobenzoic acid, p-aminobenzoic acid, 1,2-phenylenediamine, 1,3-phenylenediamine, 1,4-phenylenediamine, 2-quinolinecarboxylic acid, 2-amino-4-nitrophenol, and triazine compounds such as 2-(p-chlorophenyl)-4,6-trichloromethyl-s-triazine. Among them, pyrrolidone, N-methylpyrrolidone, o-aminobenzoic acid, m-aminobenzoic acid, p-aminobenzoic acid and 1,2-phenylenediamine are typical examples.

SUMMARY OF THE INVENTION

Although the above-described nitrogen-containing compounds can ease the T-top problem at an acid dissociation constant pKa ranging from 2 to 6, they cannot control reaction, that is, acid diffusion upon use of a highly-reactive acid-labile group.

When a weak base is added, a dark reaction in PED proceeds at an unexposed portion, thereby causing a reduction in a line size (slimming) and a decrease in film thickness on the line surface. Addition of a strong base having a pKa of 7 or greater is effective for overcoming the above-described problem.

However, higher pKa does not always bring about good results. Even when a superstrong base such as DBU (1,8-diazabicyclo[5,4,0]-7-undecene) or DBN (1,5-diazabicyclo [4,3,0]-5-nonen), proton sponge or a quaternary amine such as tetramethylammonium hydroxide is added, a sufficient effect is not available.

The present inventors have carried out various investigations. As a result, it has been found that amines represented by formulas (I) to (III) and (1) to (4) having a carbonyl group, an ester group, or a carbonate group are highly effective for preventing a decrease in the thickness of a resist film and also for enlarging a focus margin and bringing about dimensional stability.

$$N(X)_n(Y)_{3-n} \qquad (I)$$

wherein, n stands for 1, 2 or 3, preferably 1 or 2, side chains Xs may be the same or different and each independently represents —R$^1$—O—R$^2$ or —R$^1$—C(=O)—O—R$^{61}$ (in which R$^1$s are the same or different and each independently represents an alkylene group of 1 to 5 carbon atoms, R$^2$s are the same or different and each independently represents a linear, branched or cyclic alkyl group of 1 to 20 carbon atoms containing a carbonyl or ester group, and $R^{61}$s are the same or different and each independently represents a linear, branched or cyclic alkyl group of 1 to 20 carbon atoms which may contain a carbonyl group, an ester group, an ether group, a hydroxyl group or a lactone ring, or $R^1$ and $R^2$, or $R^1$ and $R^{61}$ in the same side chain may be coupled together to form a ring); and side chains Ys are the same or different and each independently represents a hydrogen atom or a linear, branched or cyclic alkyl group of 1 to 20 carbon atoms which may contain an ether or hydroxyl group.

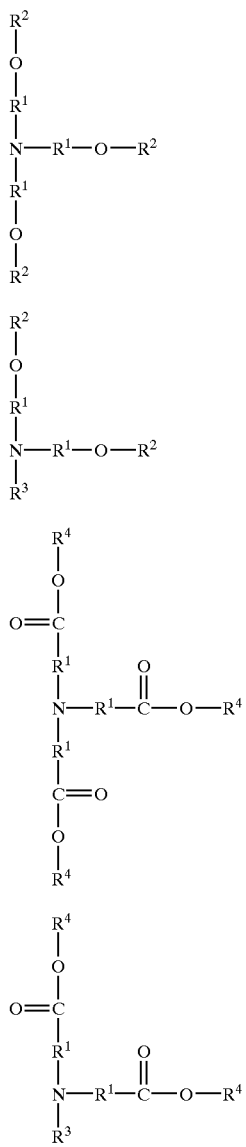

In the above-described formulas, $R^1$s are the same or different and each independently represents an alkylene group of 1 to 5 carbon atoms, $R^2$s are the same or different and each independently represents a linear, branched or cyclic alkyl group of 1 to 20 carbon atoms containing a carbonyl or ester group, $R^3$ represents a hydrogen atom or a linear, branched or cyclic alkyl group of 1 to 20 carbon atoms, and $R^4$s are the same or different and each independently represents a linear, branched or cyclic alkyl group of 1 to 20 carbon atoms which may contain a carbonyl, ester or ether group.

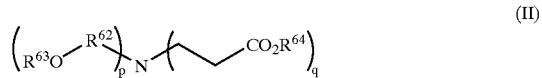

wherein, $R^{62}$ represents a linear or branched alkylene group of 1 to 5 carbon atoms, p stands for 0, 1 or 2 with the proviso that p+q=3, $R^{63}$s are the same or different and each independently represents a hydrogen atom or a linear, branched or cyclic alkyl group of 1 to 15 carbon atoms which may contain an ether, carbonyl, ester or hydroxyl group, and $R^{64}$s are the same or different and each independently represents a linear, branched or cyclic alkyl group of 1 to 20 carbon atoms which may contain a carbonyl group, an ester group, an ether group, a hydroxyl group or a lactone ring.

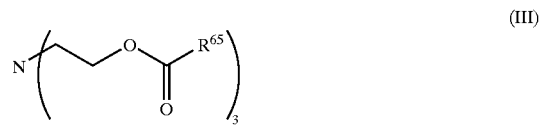

wherein, $R^{65}$s are the same or different and each independently represents a linear, branched or cyclic alkyl groups of 1 to 15 carbon atoms which may contain an ether, carbonyl, ester or hydroxyl group.

In another aspect of the present invention, there is also provided a positive type resist composition, which can comprise (A): one or more basic compounds selected from the group consisting of formulas (I) to (III) and formulas (1) to (4), (B): an organic solvent, and (C1): a base resin which is an alkali insoluble or sparingly soluble resin having an acidic functional group protected with an acid-labile group but becomes alkali soluble when the acid-labile group is eliminated, and (D): an acid generator; and optionally (E): a dissolution inhibitor.

In a further aspect of the present invention, there is also provided a negative type resist composition, which comprises (A): one or more basic compounds selected from the group consisting of formulas (I) to (III) and (1) to (4), (B): an organic solvent, and (C2): a base resin which is alkali soluble but becomes alkali sparingly soluble by crosslinking with a crosslinker, (D): an acid generator, and (F): a crosslinker which undergoes crosslinking by an acid.

DETAILED DESCRIPTION OF THE PREFERRED EMBODIMENTS

The present invention relates to a resist composition containing one or more basic compounds selected from those represented by formulas (I) to (III) and (1) to (4).

Specific examples of the basic compounds represented by formulas (I) to (III) and (1) to (4) include, but not limited to, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, and tris[2-(cyclohexyloxycarbonylmethyloxy)ethyl]amine {corresponding to the formulas (1) and (III)}; tris(2-methoxycarbonylethyl)amine and tris(2- ethoxycarbonylethyl)amine {corresponding to the formula (I), (II) and (3)}; N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis (2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, and N-(2-methoxyethyl)bis[2-(methoxycarbonyl)ethyl]amine {corresponding to the formula (I) and (II)}; N-butylbis[2-(methoxycarbonyl)ethyl]amine and N-butylbis[2-(2-methoxyethoxycarbonyl)ethyl]amine {corresponding to the formula (1) and (4)}; N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine {corresponding to the formula (I) and (2)}; tris(methoxycarbonylmethyl)amine and tris(ethoxycarbonylmethyl)amine {corresponding to the formula (I) and (3)}; N-butylbis(methoxycarbonylmethyl)amine and N-hexylbis(methoxycarbonylmethyl)amine {corresponding to the formula (I) and (4)}; and 62 -(diethylamino)-δ-valerolactone {corresponding to the formula (I)}.

As the organic solvent usable as Component (B) in the present invention, any organic solvent permitting dissolution therein of an acid generator, base resin, dissolution inhibitor or the like may be used. Examples of such an organic solvent include ketones such as cyclohexanone and methyl-2-n-amylketone, alcohols such as 3-methoxybutanol, 3-methyl-3-methoxybutanol, 1-methoxy-2-propanol and 1-ethoxy-2-propanol, ethers such as propylene glycol monomethyl ether, ethylene glycol monomethyl ether, propylene glycol monoethyl ether, ethylene glycol monoethyl ether, propylene glycol dimethyl ether and diethylene glycol dimethyl ether and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate and propylene glycol mono-tert-butyl ether acetate. They may be used either singly or in admixture of two or more, but an organic solvent usable in the present invention is not limited to them.

In the present invention, diethylene glycol dimethyl ether, 1-ethoxy-2-propanol or ethyl lactate in which the acid generator contained in the resist composition is most soluble, or propylene glycol monomethyl ether acetate which is a safe solvent, or a solvent mixture therewith is preferably employed among the above-described organic solvents.

Regarding a base polymer (C) of the present invention, a base resin (C1) which has an acidic functional group protected with an acid-labile group and is insoluble or sparingly soluble in alkali, but becomes soluble in an alkali by the elimination of the acid-labile group is usable for a positive type resist composition, while a base resin (C2) which is soluble in alkali but becomes sparingly soluble in alkali by crosslinking with a crosslinker is usable for a negative type resist composition. The "insoluble or sparingly soluble in alkali" means that solubility in an aqueous solution of 2.38% by weight of TMAH (tetramethylammonium hydroxide) is 0 or less than 20 Å/sec, and "soluble in alkali" means that solubility in an aqueous solution of 2.38% by weight of TMAH is 20 to 300 Å/sec.

Examples of the base polymer used as the component (C) in the present invention for a KrF excimer laser resist of 248 nm in wavelength, EUV resist of 3 to 20 nm in wavelength, EB resist or X-ray resist include polyhydroxystyrene (PHS) and copolymers thereof with styrene, (meth)acrylate or maleimide-N-carboxylate; those of the base polymer for an ArF excimer laser of 193 nm in wavelength include (meth)acrylate polymers, alternating copolymers of norbornene and maleic anhydride, polynorbornene polymers and metathesis ring-opening polymerization type polymers; and those for an $F_2$ excimer laser of 157 nm wavelength include the above-exemplified polymers substituted with fluorine. The base polymer (C) is however not limited thereto. In the above, "(meth)acrylate" means methacrylate or acrylate.

The base polymer (C1) usable for the positive type resist composition is obtained by substituting the hydrogen atom of the hydroxyl group of the phenol or carboxyl group of the base polymer (C2) with an acid-labile group. It is the common practice to lower the dissolution rate of an unexposed portion by such substitution.

As the acid-labile group, groups represented by the below-described formula (5) or (6), tertiary alkyl groups of 4 to 40 carbon atoms reprented by the below-described formula (7), trialkylsilyl groups of 1 to 6 carbon atoms and oxoalkyl groups of 4 to 20 carbon atoms are preferred among various groups.

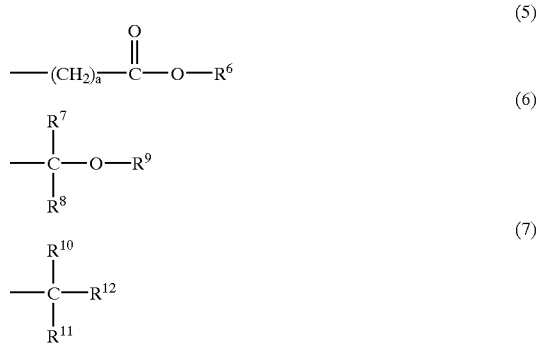

wherein, $R^6$ and $R^9$ each independently represents a linear, branched or cyclic alkyl group of 1 to 20 carbon atoms which may contain a hetero atom such as oxygen, sulfur, nitrogen or fluorine, $R^7$ and $R^8$ each independently represents a hydrogen atom or a linear, branched or cyclic alkyl group of 1 to 20 carbon atoms which may contain a hetero atom such as oxygen, sulfur, nitrogen or fluorine, and a stands for an integer of 0 to 10, or $R^7$ and $R^8$, $R^7$ and $R^9$, and $R^8$ and $R^9$ may each be coupled together to form a ring.

Additional examples of $R^6$, $R^9$ or $R^{12}$ include non-substituted or substituted aryl groups such as phenyl group and alkoxy-substituted phenyl groups, e.g., p-methylphenyl, p-ethylphenyl and p-methoxyphenyl and aralkyl groups such as benzyl and phenethyl.

Specific examples of the acid-labile group represented by the formula (5) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl groups.

Specific examples of the acid-labile group represented by the formula (6) include linear or branched acetal groups such as 1-methoxyethyl, 1-ethoxyethyl, 1-n-propoxyethyl, 1-isopropoxyethyl, 1-n-butoxyethyl, 1-isobutoxyethyl, 1-sec-butoxyethyl, 1-tert-butoxyethyl, 1-tert-amyloxyethyl, 1-ethoxy-n-propyl, 1-cyclohexyloxyethyl, methoxypropyl, ethoxypropyl, 1-methoxy-1-methylethyl and 1-ethoxy-1-methylethyl; and cyclic acetal groups such as tetrahydrofuranyl and tetrahydropyranyl groups. Preferred are ethoxyethyl, butoxyethyl and ethoxypropyl groups.

At least 0.1% of the hydrogen atoms of the hydroxyl groups of the base polymer may undergo intramolecular or intermolecular crosslinking via an acid-labile group (crosslinking group) represented by the following formula (8a) or (8b).

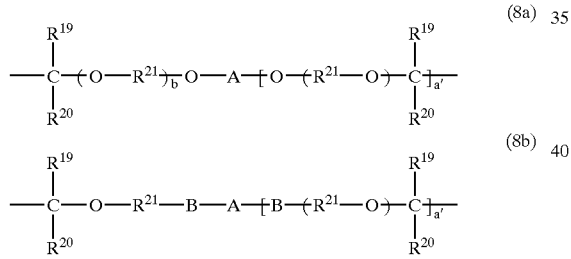

In the above formulas, $R^{19}$ and $R^{20}$ each represents a hydrogen atom or a linear, branched or cyclic alkyl group of 1 to 8 carbon atoms. $R^{19}$ and $R^{20}$ may be coupled together to form a ring and if so, $R^{19}$ and $R^{20}$ each represents a linear or branched $C_{1-8}$ alkylene group.

$R^{21}$ represents a linear, branched or cyclic alkylene group of 1 to 10 carbon atoms and b stands for 0 or an integer of 1 to 10.

A represents an aliphatic or alicyclic, saturated hydrocarbon group, aromatic hydrocarbon group or heterocyclic group having a valence of a and 1 to 50 carbon atoms. The above-described group may have a hetero atom interposed therein, or a part of the hydrogen atoms bonded to the carbon atoms of the group may be substituted with a hydroxyl group, a carboxyl group, a carbonyl group or a fluorine atom. B represents —CO—O—, —NHCO—O— or NHCONH—. a stands for an integer of 2 to 8, and a' represents an integer of 1 to 7. They satisfy the following equation of a=(a'+1).

$R^{10}$, $R^{11}$ and $R^{12}$ in the formula (7) each represents a monovalent hydrocarbon group such as linear, branched or cyclic $C_{1-20}$ alkyl group and it may contain a hetero atom such as oxygen, sulfur, nitrogen or fluorine. $R^{10}$ and $R^{11}$, $R^{10}$ and $R^{12}$, or $R^{11}$ and $R^{12}$ may be coupled together to form a ring. Alternatively, these groups may contain an oxygen atom, their hydrogen atom bonded to the carbon atom may be substituted with a hydroxyl group, or their two hydrogen atoms may be substituted with an oxygen atom toform a carbonyl-group.

Examples of the tertiary alkyl group represented by the formula (7) include tert-butyl, triethylcarbinyl, 2-ethyl-2-norbornyl, 1-methylcyclohexyl, 1-ethylcyclopentyl, 2-(2-methyl)adamantyl, 2-(2-ethyl)adamantyl and tert-amyl groups.

Examples of the trialkylsilyl group of 1 to 6 carbon atoms used as the acid-labile group include trimethylsilyl, triethylsilyl and dimethyl-tert-butylsilyl groups.

Examples of the oxoalkyl group of 4 to 20 carbon atoms used as the acid-labile group include a 3-oxocyclohexyl group and groups represented by the following formulas:

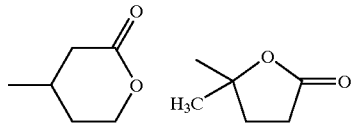

The base polymer as Component (C) preferably has a weight average molecular weight ranging from 5,000 to 100,000. The molecular weights less than 5,000 may make the film forming property and resolution property inferior, while the molecular weights exceeding 100,000, on the other hand, may make resolution property inferior.

Examples of the acid generator as Component (D) include onium salts of the below-described formula (9), diazomethane derivatives of the formula (10), glyoxime derivatives of the formula (11), β-ketosulfone derivatives, disulfone derivatives, nitrobenzyl sulfonate derivatives, sulfonate derivatives and imido-ylsulfonate derivatives.

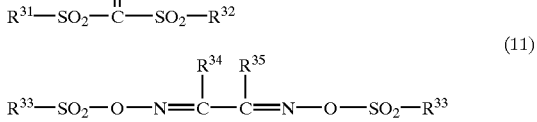

In the above-described formulas, $R^{30}$s may be the same or different and each independently represents a linear, branched or cyclic alkyl group of 1 to 12 carbon atoms, aryl group of 6 to 12 carbon atoms or aralkyl group of 7 to 12 carbon atoms, $M^+$ represents iodonium or sulfonium, $K^-$ represents a non-nucleophilic counterion and b stands for 2 or 3.

$R^{31}$ and $R^{32}$ each represents a linear, branched or cyclic alkyl group of 1 to 12 carbon atoms or halogenated alkyl group, aryl or halogenated aryl group of 6 to 12 carbon atoms, or aralkyl group of 7 to 12 carbon atoms.

$R^{33}$, $R^{34}$ and $R^{35}$ each represents a linear, branched or cyclic alkyl group or halogenated alkyl group of 1 to 12 carbon atoms, aryl or halogenated aryl group of 6 to 12 carbon atoms, or an aralkyl group of 7 to 12 carbon atoms. $R^{34}$ and $R^{35}$ may be coupled together to form a cyclic structure and if so, $R^{34}$ and $R^{35}$ each represents a linear or branched alkylene group of 1 to 6 carbon atoms.

Examples of the alkyl group of 1 to 12 carbon atoms represented by $R^{30}$ in the formula (9) include methyl, ethyl, propyl, butyl, cyclohexyl, 2-oxocyclohexyl, norbornyl and adamantyl groups. Examples of the aryl group of 6 to 12 carbon atoms include phenyl, alkoxyphenyl groups such as p-methoxyphenyl, m-methoxyphenyl, o-methoxyphenyl, ethoxyphenyl, p-tert-butoxyphenyl and m-tert-butoxyphenyl and alkylphenyl groups such as 2-methylphenyl, 3-methylphenyl, 4-methylphenyl, ethylphenyl-4-tert-butylphenyl, 4-butylphenyl and dimethylphenyl groups. Examples of the aralkyl groups of 7 to 12 carbon atoms include benzyl and phenetyl. Examples of the non-nucleophilic counterion as K⁻ include halide ions such as chloride ion and bromide ion, fluoroalkyl sulfonates such as triflate, 2,2,2-trifluoroethane sulfonate and nonafluorobutane sulfonate, aryl sulfonates such as tosylate, benzene sulfonate, 4-fluorobenzene sulfonate and 2,3,4,5,6-pentafluorobenzene sulfonate and alkyl sulfonates such as mesylate and butane sulfonate.

Examples of the alkyl group of 1 to 12 carbon atoms as $R^{31}$ or $R^{32}$ in the formula (10) include methyl, ethyl, propyl, butyl, amyl, cyclopentyl, cyclohexyl, norbornyl and adamantyl groups; those of the halogenated alkyl group of 1 to 12 carbon atoms include trifluoromethyl, 2,2,2-trifluoroethyl, 2,2,2-trichloroethyl and nonafluorobutyl groups; those of the $C_{6-12}$ aryl group include a phenyl group and alkoxyphenyl groups such as p-methoxyphenyl, m-methoxyphenyl, o-methoxyphenyl, ethoxyphenyl, p-tert-butoxyphenyl and m-tert-butoxyphenyl groups and alkylphenyl groups such as 2-methylphenyl, 3-methylphenyl, 4-methylphenyl, ethylphenyl, 4-tert-butylphenyl, 4-butylphenyl and dimethylphenyl groups; those of the halogenated aryl groups of 6 to 12 carbon atoms include fluorobenzene, chlorobenzene and 2,3,4,5,6-pentafluorobenzene groups; and those of the aralkyl group of 7 to 12 carbon atoms include benzyl and phenetyl.

Examples of the alkyl group of 1 to 12 carbon atoms, halogenated alkyl group of 1 to 12 carbon atoms, aryl group of 6 to 12 carbon atoms, halogenated aryl group of 6 to 12 carbon atoms and aralkyl group of 7 to 12 carbon atoms represented by $R^{33}$, $R^{34}$ or $R^{35}$ in the formula (11), include those described in $R^{31}$ and $R^{32}$. Examples of the alkylene group of 1 to 6 carbon atoms for $R^{34}$ or $R^{35}$ include methylene, ethylene, propylene, butylene and hexylene groups.

Specific examples of the onium salt in the formula (9) include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl (2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate and dicyclohexylphenylsulfonium p-toluenesulfonate.

Examples of the diazomethane derivative in the formula (10) include bis(benzenesulfonyl)diazomethane, bis(p-toluenesulfonyl)diazomethane, bis(xylenesulfonyl) diazomethane, bis(cyclohexylsulfonyl)diazomethane, bis (cyclopentylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, bis (tert-butylsulfonyl)diazomethane, bis(n-amylsulfonyl) diazomethane, bis(isoamylsulfonyl)diazomethane, bis(sec-amylsulfonyl)diazomethane, bis(tert-amylsulfonyl) diazomethane, 1-cyclohexylsulfonyl-1-(tert-butylsulfonyl) diazomethane, 1-cyclohexylsulfonyl-1-(tert-amylsulfonyl) diazomethane and 1-tert-amylsulfonyl-1-(tert-butylsulfonyl) diazomethane.

Examples of the glyoxime derivative in the formula (11) include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime and bis-o-(camphorsulfonyl)-α-dimethylglyoxime.

Examples of the β-ketosulfone derivative include 2-cyclohexylcarbonyl-2-(p-toluenesulfonyl)propane and 2-isopropylcarbonyl-2-(p-toluenesulfonyl)propane.

Further examples of the acid generator (D) include disulfone derivatives such as diphenyldisulfone and dicyclohexyldisulfone, nitrobenzyl sulfonate derivatives such as 2,6-dinitrobenzyl p-toluenesulfonate and 2,4-dinitrobenzyl p-toluenesulfonate, sulfonate derivatives such as 1,2,3-tris(methanesulfonyloxy)benzene, 1,2,3-tris (trifluoromethanesulfonyloxy)benzene and 1,2,3-tris(p-toluenesulfonyloxy)benzene, imido-ylsulfonate derivatives such as phthalimido-yl-triflate, phthalimido-yl-tosylate, 5-norbronene-2,3-dicarboxyimido-yl-triflate, 5-norbornene-2,3-dicarboxyimido-yl-tosylate and 5-norbornene-2,3-dicarboxyimido-yl-n-butylsulfonate.

Preferred examples include onium salts such as triphenylsulfonium trifluoromethanesulfonate, (p-tert-butoxyphenyl) diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl) diazomethane, bis(p-toluenesulfonyl)diazomethane, bis (cyclohexylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, and bis (tert-butylsulfonyl)diazomethane; glyoxime derivatives such as bis-o-(p-toluenesulfonyl)-α-dimethylglyoxime and bis-o-(n-butanesulfonyl)-α-dimethylglyoxime; and naphthoquinonediazidesulfonate derivatives.

The above-exemplified acid generators may be used either singly or in combination.

The onium salts are excellent in rectangularity improving effects, while the diazomethane derivatives and glyoxime derivatives are excellent in standing-wave reducing effects. Use of these two types of acid generators in combination makes it possible to conduct fine profile control.

The acid generator is preferably added in an amount of 0.2 to 50 parts by weight, particularly, 0.5 to 40 parts by weight based on 100 parts by weight of the base resin in total. When the amount is less than 0.2 part by weight, an acid generation amount upon exposure is small, which may lead to inferior sensitivity and resolution. Amounts exceeding 50 parts by weight, on the other hand, lower the transmittance of the resulting resist, which may lead to inferior resolution.

Examples of the dissolution inhibitor serving as the component (E) include compounds having a molecular weight of 3000 or less whose solubility in an alkali developing solution changes by acid action, particularly, compounds obtained by partially or wholly substituting a phenol or carboxylic acid derivative having a molecular weight as low as 2,500 or less with an acid-labile substituent.

Examples of the phenol or carboxylic acid derivative having a molecular weight of 2500 or less include bisphenol A, bisphenol H, bisphenol S, 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, and thymolphthalein, while those of the acid-labile substituent include those exemplified above as the acid-labile group of the base polymer.

Preferred examples of the dissolution inhibitor include bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy)) propane, 2,2-bis(4'-(2"-tetrahydrofuranyloxy)phenyl) propane, 2,2-bis(4'-tert-butoxyphenyl)propane, 2,2-bis(4'-tert-butoxycarbonyloxyphenyl)propane, 2,2-bis(4-tert-butoxycarbonylmethyloxypheny)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis (4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy) phenyl)methane, 1,1,2-tris(4'-(2"-tetrahydropyranyloxy) phenyl)ethane, 1,1,2-tris(4'-(2"-tetrahydrofuranyloxy) phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris (4'-(1'-ethoxyethoxy)phenyl)ethane, and 1,1,2- tris(4'-(1'-ethoxypropyloxy)phenyl)ethane.

In the present invention, the dissolution inhibitor is added preferably in an amount of 20 parts by weight or less, more preferably 15 parts by weight or less relative to 100 parts by weight of the solid content in the resist material. Amounts greater than 20 parts by weight increase the monomer component, may thereby deteriorating the heat resistance of the resist material.

Examples of the crosslinker as Component (F) include compounds having, in the molecule thereof, at least two hydroxymethyl groups, alkoxymethyl groups, epoxy groups or vinyl ether groups. Among them, substituted glycoluril derivatives, urea derivatives and hexa(methoxymethyl) melamine are used preferably.

Specific examples include N,N,N',N'-tetramethoxymethylurea, hexamethylmelamine, tetrahydroxymethyl-substituted glycolurils, tetraalkoxymethyl-substituted glycolurils such as tetramethoxymethyl glycoluril, bis-hydroxymethylphenols, and condensation products between phenol compounds and epichlorohydrin or the like such as bisphenol A.

Particularly preferred examples of the crosslinker include 1,3,5,7-tetraalkoxymethylglycolurils such as 1,3,5,7-tetramethoxymethylglycoluril, 1,3,5,7-tetrahydroxymethylglycoluril, 2,6-dihydroxymethyl p-cresol, 2,6-dihydroxymethylphenol, 2,2',6,6'-tetrahydroxymethyl bisphenol A, 1,4-bis-[2-(2-hydroxypropyl)]-benzene, N,N,N',N'-tetramethoxymethylurea and hexamethoxymethylmelamine.

A crosslinker which undergoes crosslinking by an acid is preferred.

The amount of the crosslinker is not limited, but it is added in an amount of 1 to 25 parts by weight, preferably 5 to 20 parts by weight based on the whole solid content of the resist composition. The above-described crosslinkers may be used either singly or in combination.

As a base, conventionally employed bases other than the above-described ones may be used either singly or in combination. Examples of the conventionally employed bases include aliphatic primary, secondary or tertiary amines, mixed amines, aromatic amines, heterocyclic amines, nitrogen-containing compounds having a carboxyl group, nitrogen-containing compounds having a sulfonyl group, nitrogen-containing compounds having a hydroxy group, nitrogen-containing compounds having a hydroxyphenyl group, alcoholic nitrogen-containing compounds, amide derivatives and imide derivatives.

Examples of the aliphatic primary amine include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine, those of the aliphatic secondary amine include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine and N,N-dimethyltetraethylenepentamine; and those of the aliphatic tertiary amine include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'- tetramethylmethylenediamine, N,N,N',N'-tetramethylenediamine and N,N,N',N'-tetramethyltetraethylenepentamine.

Examples of the mixed amine include dimethylethylamine, methylethylpropylamine, benzylamine, phenethylamine and benzyldimethylamine. Specific examples of the aromatic amine or heterocyclic amine include aniline derivatives (ex. aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, etc.), diphenyl(p-tolyl)amine, methyldiphenylamine, triphenylamine, phenylenediamine, naphthylamine, diaminonaphthalene, pyrrole derivatives (ex. pyrrole, 2H-pyrrole, 1-methylpyrrole, 2,4-dimethylpyrrole, 2,5-dimethylpyrrole, N-methylpyrrole, etc.), oxazole derivatives (ex. oxazole, isoxazole, etc.), thiazole derivatives (ex. thiazole, isothiazole, etc.), imidazole derivatives (ex. imidazole, 4-methylimidazole, 4-methyl-2-phenylimidazole, etc.), pyrazole derivatives, furazane derivatives, pyrroline derivatives (ex. pyrroline, 2-methyl-1-pyrroline, etc.), pyrrolidine derivatives (ex. pyrrolidine, N-methylpyrrolidine, pyrrolidinone, N-methylpyrrolidone, etc.), imidazoline derivatives, imidazolidine derivatives, pyridine derivatives (ex. pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, amonopyridine, dimethylaminopyridine, etc.), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (ex. quinoline, 3-quinolinecarbonitrile, etc.), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives and uridine derivatives.

Examples of the nitrogen-containing compound having a carboxyl group include aminobenzoic acid, indolecarboxylic acid, amino acid derivatives (ex. nicotinic acid, alanine, arginine, asparatic acid, glutamic acid, glycine, histidine, isoleucine, glycylleucine, leucine, methionine, phenylalanine, threonine, lysine, 3-aminopyrazine-2-carboxylic acid, methoxyalanine, etc.); those of the nitrogen containing compound having a sulfonyl group include 3-pyridinesulfonic acid and pyridinium p-toluenesulfonate; and those of the nitrogen-containing compound having a hydroxy group, nitrogen-containing compound having a hydroxyphenyl group or alcoholic nitrogen-containing compound include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide and N-(2-hydroxyethyl)isonicotinamide. Examples of the amide derivative include formamide, N-methylformamide, N,N-dimethylformamide, acetamide, N-methylacetamide, N,N-dimethylacetamide, propionamide, and benzamide, while those of the imide derivatives include phthalimide, succinimide and maleimide.

Furthermore, the basic compound represented by the below-described formula (B)-1 or (B)-2 can be incorporated.

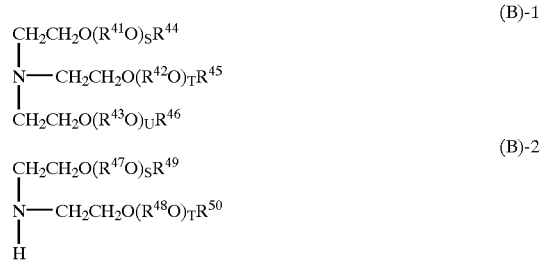

wherein, $R^{41}$, $R^{42}$, $R^{43}$, $R^{47}$ and $R^{48}$ each independently represents a linear, branched or cyclic $C_{1-20}$ alkylene group, $R^{44}$, $R^{45}$, $R^{46}$, $R^{49}$ and $R^{50}$ each independently represents a hydrogen atom, a $C_{1-20}$ alkyl group or an amino group, or $R^{44}$ and $R^{45}$, $R^{45}$ and $R^{46}$, $R^{44}$ and $R^{46}$, $R^{44}$ with $R^{45}$ and $R^{46}{}_1$, and $R^{49}$ and $R^{50}$ may each be coupled together to form a ring, and S, T and U each independently stands for an integer of 0 to 20 with the proviso that when S, T, U=0, each of $R^{44}$, $R^{45}$, $R^{46}$, $R^{49}$ and $R^{50}$ does not contain a hydrogen atom.

The alkylene group for $R^{41}$, $R^{42}$, $R^{43}$ $R^{47}$ or $R^{48}$ contains 1 to 20 carbon atoms, preferably 1 to 10 carbon atoms, more preferably 1 to 8 carbon atoms. Specific examples include methylene, ethylene, n-propylene, isopropylene, n-butylene, isobutylene, n-pentylene, isopentylene, hexylene, nonylene, decylene, cyclopentylene and cyclohexylene groups.

The alkyl group for $R^{44}$, $R^{45}$, $R^{46}$, $R^{49}$ or $R^{50}$, contains 1 to 20 carbon atoms, preferably 1 to 8 carbon atoms, more preferably 1 to 6 carbon atoms. Specific examples include methyl, ethyl, n-propyl, isopropyl, n-butyl, isobutyl, tert-butyl, n-pentyl, isopentyl, hexyl, nonyl, decyl, dodecyl, tridecyl, cyclopentyl and cyclohexyl groups.

When $R^{44}$ and $R^{45}$, $R^{45}$ and $R^{46}$, $R^{44}$ and $R^{46}$, $R^{44}$ and $R^{45}$ and $R^{46}$, or $R^{49}$ and $R^{50}$ form a ring, the ring has 1 to 20, preferably 1 to 8, more preferably 1 to 6 carbon atoms. In this ring, a $C_{1-6}$, particularly $C_{1-4}$ alkyl group may be branched.

S, T and U each stands for an integer of 0 to 20, preferably 1 to 10, more preferably 1 to 8.

Specific examples of the Compound (B)-1 or (B)-2 include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, and 1-aza-12-crown-4,1-aza-15-crown-5,1-aza-18-crown-6.

In the present invention, the basic compound is preferably incorporated in an amount of 0.001 to 2 parts by weight, particularly 0.01 to 1 part by weight relative to 100 parts by weight of the whole basic resin. Amounts less than 0.001 part by weight may not bring about any incorporating effects, while those exceeding 2 parts by weight may excessively lower the sensitivity.

For efficient synthesis of the base of the present invention, Michael addition (exemplified by the formula IV) or alkylation (exemplified by the formula V) of an amine, and acylation or etherification (exemplified by the formula VI) of an alkanolamine are used either singly or in combination. The synthesis process is however not limited thereto.

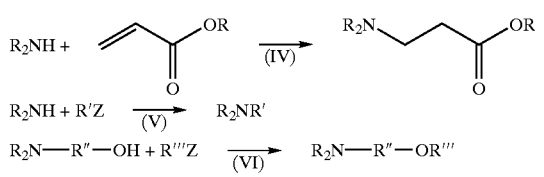

wherein, R and R' may be the same or different and each independently represents a substituted or unsubstituted methyl group, R" represents an alkylene group, R''' represents a substituted or unsubstituted methyl group (in the case of etherification) or a substituted or unsubstituted acyl group (in the case of acylation), and Z represents a leaving group such as halogen.

EXAMPLES

The present invention will hereinafter be described more specifically by Synthesis Examples, Examples and Comparative Examples. It should however be borne in mind that the present invention is not limited to or by them.

The basic compound of the present invention was synthesized in the below-described manner.

Synthesis Example 1

Synthesis of tris(2-Formyloxyethyl)amine

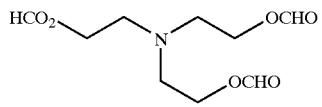

A mixture of 6.00 g of triethanolamine and 200 g of formic acid was heated to 100° C. for 20 hours. After removal of the formic acid by distillation under reduced pressure, the residue was diluted with ethyl acetate, followed by neutralization with a saturated aqueous solution of sodium bicarbonate. After separation into layers, washing with water and drying over anhydrous sodium sulfate, concentration was conducted under reduced pressure. The residue was purified by distillation under reduced pressure, whereby 8.10 g of tris(2-formyloxyethyl)amine was obtained (boiling point: 127 to 131° C./60 Pa, yield: 86%).

IR (thin film): ν=2954, 2839, 1722, 1458, 1362, 1282, 1165, 1076, 1005 cm$^{-1}$. $^1$H-NMR (300 MHz in CDCl$_3$): δ=2.86 (6H, t, J=5.9 Hz), 4.19 (6H, t, J=5.9 Hz), 8.03 (3H, s).

Synthesis Example 2

Synthesis of tris(2-Acetoxyethyl)amine

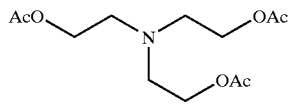

In 150 g of THF was dissolved 14.9 g of triethanolamine. To the resulting solution was added 40.4 g of triethylamine. After cooling over an ice bath, 27.5 g of acetyl chloride was added dropwise at a temperature not exceeding 30° C. The reaction mixture was heated to 75° C. over an oil bath and heated for 2 hours to be refluxed. After completion of the maturation, the reaction mixture was allowed to cool down to room temperature. The reaction was terminated by the addition of 100 g of water. To the organic layer thus separated was added 200 g of dichloromethane. The organic layer was washed with 100 g of water. The organic layer was concentrated under reduced pressure, followed by distillation under reduced pressure, whereby 20.6 g of the title tris(2-acetoxyethyl)amine was obtained (boiling point: 145 to 148° C./70 Pa, yield: 75%).

$^3$H-NMR (300 MHz in CDCl$_3$): δ=2.02 (9H, s), 2.80 (6H, t), 4.08 (6H, t).

Synthesis Example 3

Synthesis of tris(2-propionyloxyethyl)amine

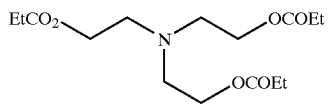

In a similar manner to Synthesis Example 2 except for the use of propionyl chloride instead of acetyl chloride, tris(2-propionyloxyethyl)amine was synthesized (boiling point: 154 to 155° C./30 Pa, yield: 82%).

$^1$H-NMR (300 MHz in CDCl$_3$): δ=1.09 (9H, t), 2.29 (6H, q), 2.80 (6H, t), 4.08 (6H, t).

Synthesis Example 4

Synthesis of tris(2-Butyryloxyethyl)amine

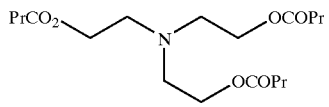

In a similar manner to Synthesis Example 2 except for the use of butyryl chloride instead of acetyl chloride, tris(2-butyryloxyethyl)amine was synthesized (boiling point: 183 to 185° C./30 Pa, yield: 68%).

$^1$H-NMR (300 MHz in CDCl$_3$): δ=0.92 (9H, t), 1.62 (6H, m), 2.25 (6H, t), 4.09 (6H, t), 2.81 (6H, t).

Synthesis Example 5

Synthesis of tris(2-Isobutyryloxyethyl)amine

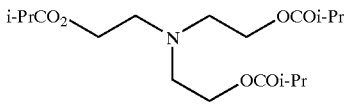

In a similar manner to Synthesis Example 2 except for the use of isobutyryl chloride instead of acetyl chloride, tris(2-isobutyryloxyethylamine was synthesized (boiling point: 179 to 180° C./30 Pa, yield: 87%).

$^1$H-NMR (300 MHz in CDCl$_3$): δ=1.13 (18H, d), 2.51 (3H, m), 2.82 (6H, t), 4.09 (6H, t).

Synthesis Example 6

Synthesis of tris(2-Valeryloxyethyl)amine:

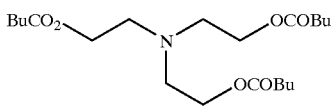

In a similar manner to Synthesis Example 2 except for the use of valeryl chloride instead of acetyl chloride, tris(2-valeryloxyethyl)amine was synthesized (boiling point: 190 to 193° C./30 Pa, yield: 75%).

$^1$H-NMR (300 MHz in CDCl$_3$): δ=0.89 (9H, t), 1.32 (6H, m), 1.58 (6H, m), 2.28 (6H, t), 4.10 (6H, t).

Syntheis Example 7

Synthesis of tris(2-Pivaloyloxyethyl)amine

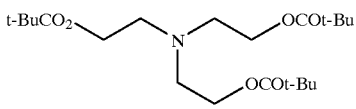

In a similar manner to Synthesis Example 2 except for the use of pivaloyl chloride instead of acetyl chloride, tris(2-pivaloyloxyethyl)amine was synthesized (boiling point: 183 to 185° C./30 Pa, yield: 60%).

$^1$H-NMR (300 MHz in CDCl$_3$): δ=1.17 (27H, s), 2.83 (6H, t), 4.09 (6H, t).

Syntheis Example 8

Synthesis of N,N-bis(2-Acetoxyethyl)-2-(acetoxyacetoxy)ethylamine

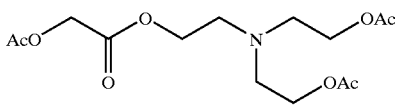

In 150 g of THF was dissolved 14.9 g of triethanolamine. To the resulting solution was added 40.4 g of triethylamine. The resulting mixture was cooled over ice bath and 15.7 g of acetyl chloride was added dropwise at a temperature not exceeding 30° C. The reaction mixture was heated over an oil bath to 75° C. and heating was conducted for 2 hours under reflux. Then, 20.5 g of acetoxyacetyl chloride was added and the resulting mixture was heated under reflux for further 2 hours. After the reaction mixture was allowed to be cooled down, 100 g of water was added to terminate the reaction. The organic layer thus separated was added with 200 g of dichloromethane, and then washed with 100 g of water. The organic layer was concentrated under reduced pressure, followed by distillation under reduced pressure, whereby 18.3 g of N,N-bis(2-acetoxyethyl)-2-(acetoxyacetoxy)ethylamine was obtained as. the title compound (boiling point: 153 to 155° C./24 Pa, yield: 55%).

IR (thin film): ν=2958, 2837, 1740, 1425, 1373, 1238, 1198, 1082, 1043 cm$^{-1}$. $^1$H-NMR (300 MHz in CDCl$_3$): δ=2.03 (6H, s), 2.13 (3H, s), 2.75–2.85 (6H, m), 4.08 (4H, t, J=6.2 Hz), 4.19 (2H, t, J=6.0 Hz), 4.58 (2H, s).

Syntheis Example 9

Synthesis of tris(2-Methoxycarbonyloxyethyl)amine

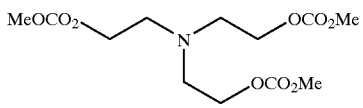

In a similar manner to Synthesis Example 2 except for the use of methyl chloroformate instead of acetyl chloride, tris(2-methoxycarbonyloxyethyl)amine was synthesized.

Syntheis Example 10

Synthesis of tris(2-tert-Butoxycarbonyloxyethyl)amine

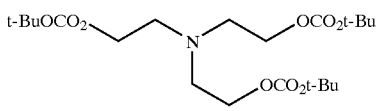

In a similar manner to Synthesis Example 2 except for the use of di-tert-butyl pyrocarboxylate instead of acetyl chloride, tris(2-tert-butoxycarbonyloxyethyl)amine was synthesized.

Syntheis Example 11

Synthesis of tris[2(2-Oxopropoxy)ethyl]amine

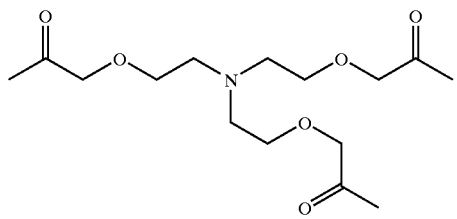

In a similar manner to Synthesis Example 2 except for the use of chloroacetone instead of acetyl chloride, tris[2-(2-oxopropoxy)ethyl]amine was synthesized.

Syntheis Example 12

Synthesis of tris[2-(Methoxycarbonylmethyl)oxyethyl]amine

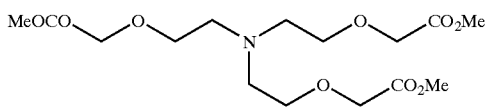

In a similar manner to Synthesis Example 2 except that methyl chloroacetate was used instead of acetyl chloride and 1.0 g of sodium iodide was added further, tris[2-(methoxycarbonylmethyl)oxyethyl]amine was synthesized.

Syntheis Example 13

Synthesis of tris[2-(tert-Butoxycarbonylmethyloxy)ethyl]amine

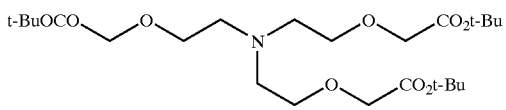

In a similar manner to Synthesis Example 12 except for the use of tert-butyl chloroacetate instead of methyl chloroacetate, tris[2-(tert-butoxycarbonylmethyl)oxyethyl]amine was synthesized.

Syntheis Example 14

Synthesis of tris[2-(Cyclohexyloxycarbonylmethyloxy)ethyl]amine

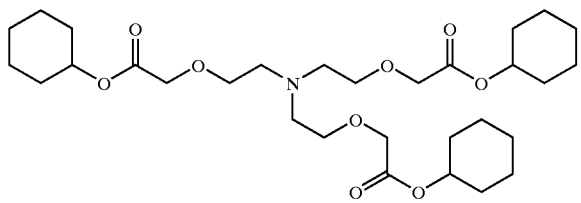

In a similar manner to Synthesis Example 12 except for the use of cyclohexyl chloroacetate instead of methyl chloroacetate, tris[2-(cyclohexyloxycarbonylmethyiloxy)ethyl]amine was synthesized.

Syntheis Example 15

Synthesis of tris(2-Methoxycarbonylethyl)amine

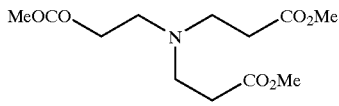

While vigorously stirring at 0° C., 5.00 g of 28% aqueous ammonia was added to 21.2 g of methyl acrylate. The resulting mixture was heated gradually to 25° C. over 20 hours. After concentration under reduced pressure, the residue was-purified by distillation under reduced pressure, whereby tris(2-methoxycarbonylethyl)amine was obtained (boiling point: 143° C./70 Pa, yield: 76%), IR (thin film): $\nu$=2954, 2839, 1738, 1437, 1255, 1200, 1172 cm$^{-1}$. $^1$H-NMR (300 MHz in CDCl$_3$): $\delta$=2.41 (6H, t, J=7.7 Hz), 2.73 (6H, t, J=7.7 Hz), 3.63 (9H, s).

Syntheis Example 16

Synthesis of tris(2-Ethoxycarbonylethyl)amine

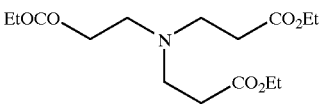

In a similar manner to Synthesis Example 15 except for the use of ethyl acrylate instead of methyl acrylate, tris(2-ethoxycarbonylethyl)amine was synthesized.

Syntheis Example 17

Synthesis of N,N-bis(2-Hydroxyethyl)-2-(methoxycarbonyl)ethylamine

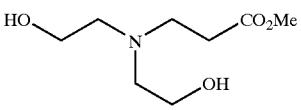

At 20 to 30° C., 9.01 g of methyl acrylate was added to 10.0 g of diethanolamine. The resulting mixture was allowed to stand for 20 hours. The reaction mixture was concentrated under reduced pressure, whereby N,N-bis(2-hydroxyethyl)-2-(methoxycarbonyl)ethylamine was obtained (yield: 98%).

IR (thin film): $\nu$=3385 (br.), 2953, 2881, 2833, 1734, 1439, 1404, 1363, 1259, 1198, 1035 cm$^{-1}$. $^1$H-NMR (270 MHz in CDCl$_3$): $\delta$=2.48 (2H, t, J=6.3 Hz), 2.62 (4H, t, J=5.1 Hz), 2.83 (2H, t, J=6.3 Hz), 3.01 (1H, br.s), 3.58 (4H, t, J=5.1 Hz, 3.67 (3H, s).

Syntheis Example 18

Synthesis of N,N-bis(2-Acetoxyethyl)-2-(methoxycarbonyl)ethylamine

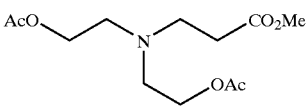

At 20 to 30° C., acetic anhydride was added to a mixture of 9.29 g of N,N-bis(2-hydroxyethyl)-2-(methoxycarbonyl) ethylamine, 12.8 g of triethylamine, 50 mg of 4-dimethylaminopyridine and 50 ml of THF and the resulting mixture was stirred for 20 hours. Water was added to terminate the reaction. The reaction mixture was extracted with ethyl acetate. The organic layer was then washed with water and dried over anhydrous sodium sulfate. After concentration under reduced pressure, the residue was purified by distillation under reduced pressure, whereby 13.2 g of N,N-bis(2-acetoxyethyl)-2-(methoxycarbonyl)ethylamine was obtained (boiling point: 118 to 123° C./21 Pa, yield: 99%).

IR (thin film): $\nu$=2954, 2837, 1740, 1437, 1373, 1238, 1203, 1039 cm$^{-1}$. $^1$H-NMR (270 MHz in CDCl$_3$): $\delta$=2.02 (6H, s), 2.42 (2H, t, J=7.1 Hz), 2.74 (4H, t, J=5.9 Hz), 2.87 (2H, t, J=7.1 Hz), 3.64 (3H, s), 4.07 (4H, t, J=5.9 Hz).

Syntheis Example 19

Synthesis of N,N-bis(2-Hydroxyethyl)-2-(ethoxycarbonyl)ethylamine

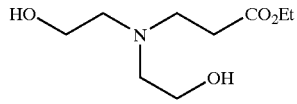

In a similar manner to Synthesis Example 17 except for the use of ethyl acrylate instead of methyl acrylate, N,N-bis(2-hydroxyethyl)-2-(ethoxycarbonyl)ethylamine was synthesized (yield: 94%).

IR (thin film): ν=3400 (br.), 2951, 2875, 2829, 1732, 1462, 1400, 1371, 1255, 1190, 1039 cm$^{-1}$. $^1$H-NMR (300 MHz in CDCl$_3$): δ=1.24 (3H, t, J=7.2 Hz), 2.46 (2H, t, J=7.1 Hz), 2.60 (4H, m), 2.82 (2H, t, J=7.1 Hz), 3.17 (2H, br.s), 3.57 (4H, m), 4.12 (2H, q, J=7.2 Hz).

Syntheis Example 20

Synthesis of N,N-bis(2-Acetoxyethyl)-2-(ethoxycarbonyl)ethylamine

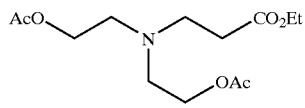

In a similar manner to Synthesis Example 18 except for the use of N,N-bis(2-hydroxyethyl)-2-(ethoxycarbonyl)ethylamine instead of N,N-bis(2-hydroxyethyl)-2-(methoxycarbonyl)ethylamine, N,N-bis(2-acetoxyethyl)-2-(ethoxycarbonyl)ethylamine was synthesized.

Syntheis Example 21

Synthesis of N,N-bis(2-Hydroxyethyl)-2-(2-methoxyethoxycarbonyl)ethylamine

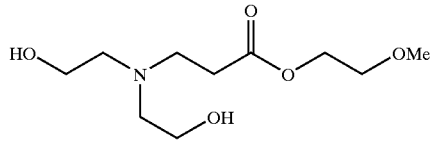

In a similar manner to Synthesis Example 17 except for the use of 2-methoxyethyl acrylate instead of methyl acrylate, N,N-bis(2-hydroxyethyl)-2-(2-methoxyethoxycarbonyl)ethylamine was synthesized (yield: 97%).

Syntheis Example 22

Synthesis of N,N-bis(2-Acetoxyethyl)-2-(2-methoxyethoxycarbonyl)ethylamine

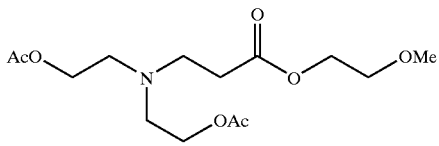

In a similar manner to Synthesis Example 18 except for the use of N,N-bis(2-hydroxyethyl)-2-(2-methoxyethoxycarbonyl)ethylamine instead of N,N-bis(2-hydroxyethyl)-2-(methoxycarbonyl)ethylamine, N,N-bis(2-acetoxyethyl)-2-(2-methoxyethoxycarbonyl)ethylamine was synthesized (boiling point: 146 to 148° C./9.3 Pa, yield: 86%).

IR (thin film): ν=2954, 2893, 2825, 1738, 1456, 1371, 1238, 1198, 1130, 1039 cm$^{-1}$. $^1$H-NMR (300 MHz in CDCl$_3$): δ=2.02 (6H, s), 2.46 (2H, t, J=7.1 Hz), 2.74 (4H, t, J=6.0 Hz), 2.88 (2H, t, J=7.1 Hz), 3.36 (3H, s), 3.56 (2H, m), 4.08 (4H, t, J=6.0 Hz), 4.20 (2H, m).

Syntheis Example 23

Synthesis of N,N-bis(2-Hydroxyethyl)-2-(2-hydroxyethoxycarbonyl)ethylamine

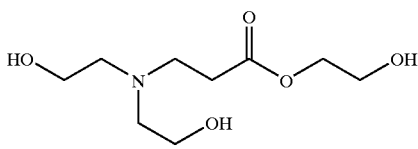

In a similar manner to Synthesis Example 17 except for the use of 2-hydroxyethyl acrylate instead of methyl acrylate, N,N-bis(2-hydroxyethyl)-2-(2-hydroxyethoxycarbonyl)ethylamine was synthesized (yield: 99%)

Syntheis Example 24

Synthesis of N,N-bis(2-Acetoxyethyl)-2-(2-acetoxyethoxycarbonyl)ethylamine

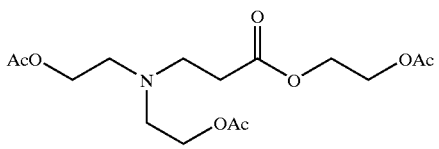

In a similar manner to Synthesis Example 18 except for the use of N,N-bis(2-hydroxyethyl)-2-(2-hydroxyethoxycarbonyl)ethylamine instead of N,N-bis(2-hydroxyethyl)-2-(methoxycarbonyl)ethylamine, N,N-bis(2-acetoxyethyl)-2-(2-acetoxyethoxycarbonyl)ethylamine was synthesized (boiling point: 164 to 166° C./27 Pa, yield: 96%).

IR (thin film): ν=2960, 2837, 1740, 1443, 1375, 1236, 1190, 1043 cm$^{-1}$. $^1$H-NMR (300 MHz in CDCl$_3$): δ=2.02 (6H, s), 2.05 (3H, s), 2.45 (2H, t, J=6.9 Hz), 2.75 (4H, t, J=6.1 Hz), 2.88 (2H, t, J=6.9 Hz), 4.08 (4H, t, J=6.1 Hz), 4.25 (4H, s).

Syntheis Example 25

Synthesis of N,N-bis(2-Hydroxyethyl)-2-[(methoxycarbonyl)methoxycarobnyl]ethylamine:

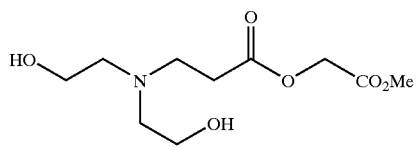

In a similar manner to Synthesis Example 17 except for the use of methoxycarbonylmethyl acrylate instead of methyl acrylate, N,N-bis(2-hydroxyethyl)-2-[(methoxycarbonyl)-methoxycarbonyl]ethylamine was synthesized.

Syntheis Example 26

Synthesis of N,N-bis(2-Acetoxyethyl)-2-[(methoxycarbonyl)methoxycarbonyl]ethylamine

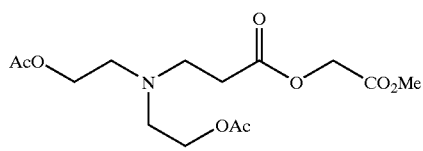

In a similar manner to Synthesis Example 18 except for the use of N,N-bis(2-hydroxyethyl)-2-[(methoxycarbonyl)methoxycarbonyl]ethylamine instead of N,N-bis(2-hydroxyethyl)-2-(methoxycarbonyl)ethylamine, N,N-bis(2-acetoxyethyl)-2-[(methoxycarbonyl)methoxycarbonyl]ethylamine was synthesized (boiling point: 154 to 157° C./17 Pa, yield: 60%).

IR (thin film): $\nu$=2956, 2837, 1740, 1439, 1377, 1236, 1180, 1041 cm$^{-1}$. $^1$H-NMR (300 MHz in CDCl$_3$): $\delta$=2.02 (6H, s), 2.54 (2H, t, J=7.1 Hz), 2.76 (4H, t, J=5.9 Hz), 2.92 (2H, t, J=7.1 Hz), 3.74 (3H, s), 4.09 (4H, t, J=5.9 Hz), 4.59 (2H, s).

Syntheis Example 27

Synthesis of N,N-bis(2-Hydroxyethyl)-2-(2-oxopropoxycarbonyl)ethylamine

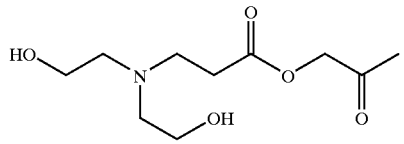

In a similar manner to Synthesis Example 17 except for the use of 2-oxopropyl acrylate instead of methyl acrylate, N,N-bis(2-hydroxyethyl)-2-(2-oxopropoxycarbonyl)ethylamine was synthesized (yield: 98%).

Syntheis Example 28

Synthesis of N,N-bis(2-Acetoxyethyl)-2-(2-oxopropoxycarbonyl)ethylamine

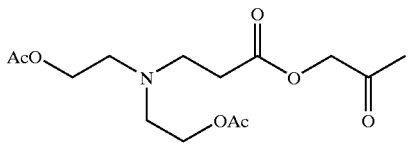

In a similar manner to Synthesis Example 18 except for the use of N,N-bis(2-hydroxyethyl)-2-(2-oxopropoxycarbonyl)ethylamine instead of N,N-bis(2-hydroxyethyl)-2-(methoxycarbonyl)ethylamine, N,N-bis(2-acetoxyethyl)-2-(2-oxopropoxycarbonyl)ethylamine was synthesized (boiling point: 165° C./27 Pa, yield: 85%).

IR (thin film): $\nu$=2960, 2837, 1736, 1421, 1373, 1238, 1174, 1041 cm$^{-1}$. $^1$H-NMR (300 MHz in CDCl$_3$): $\delta$=2.02 (6H, s), 2.13 (3H, s), 2.55 (2H, t, J=7.1 Hz), 2.76 (4H, t, J=5.9 Hz), 2.92 (2H, t, J=7.1 Hz), 4.08 (4H, t, J=5.9 Hz), 4.63 (2H, s).

Syntheis Example 29

Synthesis of N,N-bis(2-Hydroxyethyl)-2-(tetrahydrofurfuryloxycarbonyl)ethylamine

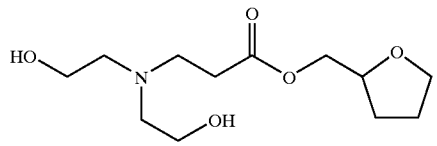

In a similar manner to Synthesis Example 17 except for the use of tetrahydrofurfuryl acrylate instead of methyl acrylate, N,N-bis(2-hydroxyethyl)-2-(tetrahydrofurfuryloxycarbonyl)ethylamine was synthesized (yield: 97%).

Syntheis Example 30

Synthesis of N,N-bis(2-Acetoxyethyl)-2-(tetrahydrofurfuryloxycarbonyl)ethylamine

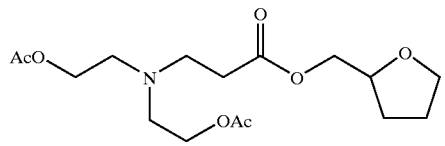

In a similar manner to Synthesis Example 18 except for the use of N,N-bis(2-hydroxyethyl)-2-(tetrahydrofurfuryloxycarbonyl)ethylamine instead of N,N-bis(2-hydroxyethyl)-2-(methoxycarbonyl)ethylamine, N,N-bis(2-acetoxyethyl)-2-(tetrahydrofurfuryloxycarbonyl)ethylamine was synthesized (boiling point: 165° C./20 Pa, yield: 76%).

IR (thin film): $\nu$=2958, 2873, 1740, 1450, 1371, 1238, 1193, 1039 cm$^{-1}$. $^1$H-NMR (300 MHz in CDCl$_3$): $\delta$=0.56 (1H, m), 1.80–2.10 {10H, m including 2.02 (6H, s)}, 2.47 (2H, t, J=7.1 Hz), 2.74 (4H, t, J=6.0 Hz), 2.88 (2H, t, J=7.1 Hz), 3.70–4.20 {9H, m including 4.06 (4H, t, J=6.0 H)}.

Syntheis Example 31

Synthesis of N,N-bis(2-Hydroxyethyl)-2-[(2-oxotetrahydrofuran-3-yl)oxycarbonyl]ethylamine

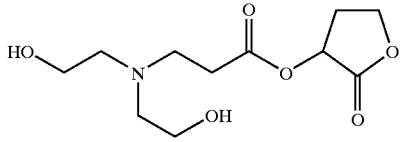

In a similar manner to Synthesis Example 17 except for the use of (2-oxotetrahydrofuran-3-yl) instead of methyl acrylate, N,N-bis(2-hydroxyethyl)-2-[(2-oxotetrahydrofuran-3-yl)oxycarbonyl]ethylamine was synthesized.

Syntheis Example 32

Synthesis of N,N-bis(2-Acetoxyethyl)-2-[(2-oxotetrahydrofuran-3-yl)oxycarbonyl]ethylamine

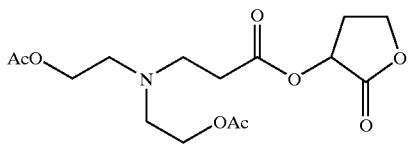

In a similar manner to Synthesis Example 18 except that N,N-bis(2-hydroxyethyl)-2-[(2-oxotetrahydrofuran-3-yl)oxycarbonyl]ethylamine was used instead of N,N-bis(2-hydroxyethyl)-2-(methoxycarbonyl)ethylamine, and purification was conducted by silica gel chromatography, N,N-bis(2-acetoxyethyl)-2-[(2-oxotetrahydrofuran-3-yl)oxycarbonyl]ethylamine was synthesized (yield: 70%).

IR (thin film): ν=2962, 2837, 1792, 1743, 1668, 1456, 1437, 1373, 1240, 1196, 1095, 1043 $cm^{-1}$.

Syntheis Example 33

Synthesis of N,N-bis(2-Hydroxyethyl)-2-(4-hydroxybutoxycarbonyl)ethylamine

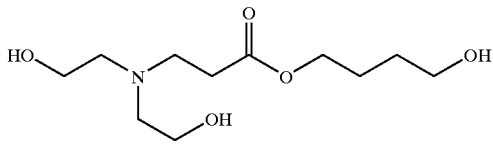

In a similar manner to Synthesis Example 17 except for the use of 4-hydroxybutyl acrylate instead of methyl acrylate, N,N-bis(2-hydroxyethyl)-2-(4-hydroxybutoxycarbonyl)ethylamine was synthesized.

Syntheis Example 34

Synthesis of N,N-bis(2-Formyloxyethyl)-2-(4-formyloxybutoxycarbonyl)ethylamine

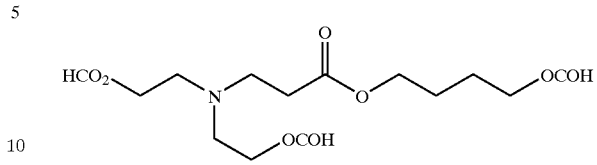

In a similar manner to Synthesis Example 1 except for the use of N,N-bis(2-hydroxyethyl)-2-(4-hydroxybutoxycarbonyl)ethylamine instead of triethanolamine, N,N-bis(2-formyloxyethyl)-2-(4-formyloxybutoxycarbonyl)ethylamine was synthesized (yield: 70%).

IR (thin film): ν=2960, 2839, 1722, 1466, 1363, 1254, 1176, 1065 $cm^{-1}$. $^1$H-NMR (270 MHz in $CDCl_3$): δ=1.65–1.80 (4H, m), 2.44 (2H, t, J=7.2 Hz), 2.80 (4H, t, J=5.8 Hz), 2.89 (2H, t, J=7.2 Hz), 4.05–4.25 (8H, m), 8.03 (2H, s), 8.04 (1H, s).

Syntheis Example 35

Synthesis of N,N-bis(2-Formyloxyethyl)-2-(2-formyloxyethoxycarbonyl)ethylamine

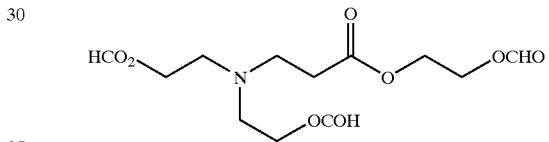

In a similar manner to Synthesis Example 1 except for the use of N,N-bis(2-hydroxyethyl)-2-(2-hydroxyethoxycarbonyl)ethylamine instead of triethanolamine, N,N-bis(2-formyloxyethyl)-2-(2-formyloxyethoxycarbonyl)ethylamine was synthesized (yield: 40%).

IR (thin film): ν=2956, 2839, 1722, 1456, 1275, 1254, 1173, 1061 $cm^{-1}$. $^1$H-NMR (270 MHz in $CDCl_3$): δ=2.47 (2H, t, J=7.0 Hz), 2.80 (4H, t, J=5.9 Hz), 2.90 (2H, t, J=7.0 Hz), 4.19 (4H, t, J=5.9 Hz), 4.25–4.40 (4H, m), 8.03 (2H, s), 8.06 (1H, s).

Syntheis Example 36

Synthesis of N,N-bis(2-Methoxyethyl)-2-(methoxycarbonyl)ethylamine

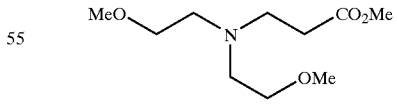

In a similar manner to Synthesis Example 17 except that bis(2-methoxyethyl)amine was used instead of diethanolamine, and purification was conducted by distillation under reduced pressure, N,N-bis(2-methoxyethyl)-2-(methoxycarbonyl)ethylamine was synthesized (boiling point: 71 to 75° C./27 Pa, yield: 93%).

IR (thin film): ν=2951, 2927, 2877, 2818, 1740, 1437, 1254, 1198, 1119 $cm^{-1}$. $^1$H-NMR (270 MHz in $CDCl_3$):

δ=2.46 (2H, t, J=7.3 Hz), 2.69 (4H, t, J=6.0 Hz), 2.89 (2H, t, J=7.3 Hz), 3.31 (6H, s), 3.43 (4H, t, J=6.0 Hz), 3.64 (3H, s).

Syntheis Example 37

Synthesis of N-(2-Hydroxyethyl)bis[2-(methoxycarbonyl)ethyl]amine

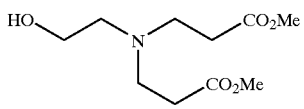

At 20 to 30° C., 15.5 g of methyl acrylate was added to 5.00 g of 2-aminoethanol. The resulting mixture was allowed to stand for 20 hours, followed by concentration under reduced pressure, whereby 19.2 g of N-(2-hydroxyethyl)bis[2-(methoxycarbonyl)ethyl]amine was obtained (at a quantitative yield).

IR (thin film): ν=3467 (br.), 2954, 2839, 1738, 1439, 1361, 1257, 1201, 1176, 1038 cm$^{-1}$. $^1$H-NMR (300 MHz in CDCl$_3$): δ=2.43 (4H, t, J=6.8 Hz), 2.55 (2H, m), 2.75 (4H, t, J=6.8 Hz), 2.93 (1H, br.s), 3.54 (2H, m), 3.64 (6H, s).

Syntheis Example 38

Synthesis of N-(2-Acetoxyethyl)bis[2-(methoxycarbonyl)ethyl]amine

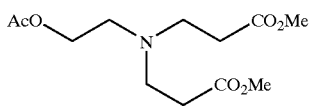

At 20 to 30° C., 2.56 g of acetic anhydride was added to a mixture of 5.00 g of N-(2-hydroxyethyl)bis[2-(methoxycarbonyl)ethyl]amine, 2.97 g of triethylamine, 50 mg of 4-dimethylaminopyridine and 25 g of THF. The resulting mixture was stirred for 5 hours. Water was added to terminate the reaction. The reaction mixture was then extracted with ethyl acetate. The organic layer was washed with water and dried over anhydrous sodium sulfate. After concentration under reduced pressure, the residue was purified by distillation under reduced pressure, whereby 5.30 g of N-(2-acetoxyethyl)bis[2-(methoxycarbonyl)ethyl]amine was obtained (boiling point: 120° C./15 Pa, yield: 92%).

IR (thin film): ν=2954, 2839, 1740, 1439, 1373, 1238, 1200, 1176, 1039 cm$^{-1}$. $^1$H-NMR (300 MHz in CDCl$_3$): δ=2.01 (3H, s), 2.41 (4H, t, J=6.9 Hz), 2.67 (2H, t, J=6.0 Hz), 2.79 (4H, t, J=6.9 Hz), 3.63 (6H, s), 4.06 (2H, t, J=6.0 Hz).

Syntheis Example 39

Synthesis of N-(2-Hydroxyethyl)bis[2-(ethoxycarbonyl)ethyl]amine

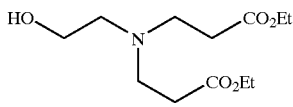

In a similar manner to Synthesis Example 37 except for the use of ethyl acrylate instead of methyl acrylate, N-(2-hydroxyethyl)bis[2-(ethoxycarbonyl)ethyl]amine was synthesized (yield: 82%).

IR (thin film): ν=3502 (br.), 2981, 2829, 1734, 1463, 1371, 1346, 1255, 1184, 1039 cm$^{-1}$. $^1$H-NMR (300 MHz in CDCl$_3$): δ=1.23 (6H, t, J=7.1 Hz), 2.42 (4H, t, J=6.7 Hz), 2.57 (2H, m), 2.77 (4H, t, J=6.7 Hz), 2.96 (1H, m), 3.55 (2H, m), 4.10 (4H, q, J=7.1 Hz).

Syntheis Example 40

Synthesis of N-(2-Acetoxyethyl)bis[2-(ethoxycarbonyl)ethyl]amine

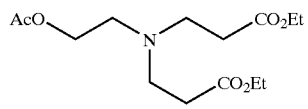

In a similar manner to Synthesis Example 38 except for the use of N-(2-hydroxyethyl)bis[2-(ethoxycarbonyl)ethyl]amine instead of N-(2-hydroxyethyl)bis[2-(methoxycarbonyl)ethyl]amine, N-(2-acetoxyethyl)bis[2-(ethoxycarbonyl)ethyl]amine was synthesized.

Syntheis Example 41

Synthesis of N-(3-Hydroxy-1-propyl)bis[2-(methoxycarbonyl)ethyl]amine

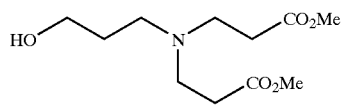

In a similar manner to Synthesis Example 37 except for the use of 3-amino-1-propanol instead of 2-aminoethanol, N-(3-hydroxy-1-propyl)bis[2-(methoxycarbonyl)ethyl]amine was synthesized (at a quantitative yield).

IR (thin film): ν=3435 (br.), 2953, 2841, 1738, 1439, 1358, 1331, 1255, 1200, 1174, 1134, 1051 cm$^{-1}$. $^1$H-NMR (300 MHz in CDCl$_3$): δ=1.66 (2H, m), 2.47 (4H, t, J=7.0 Hz), 2.60 (2H, m), 2.76 (4H, t, J=7.0 Hz), 3.65 (9H, s), 3.68 (2H, m), 3.83 (1H, br.s).

Syntheis Example 42

Synthesis of N-(3-Acetoxy-1-propyl)bis[2-(methoxycarbonyl)ethyl]amine

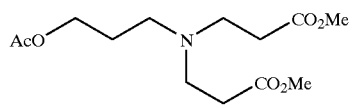

In a similar manner to Synthesis Example 38 except for the use of N-(3-hydroxy-1-propyl)bis[2-(methoxycarbonyl)ethyl]amine instead of N-(2-hydroxyethyl)bis[2-(methoxycarbonyl)ethyl]amine, N-(3-acetoxy-1-propyl)bis[2-(methoxycarbonyl)ethyl]amine was synthesized.

Syntheis Example 43

Synthesis of N-(2-Methoxyethyl)bis[2-(methoxycarbonyl)ethyl]amine

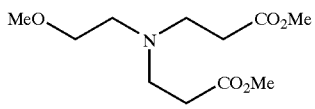

In a similar manner to Synthesis Example 37 except for the use of 2-methoxyethylamine instead of 2-aminoethanol, N-(2-methoxyethyl)bis[2-(methoxycarbonyl)ethyl]amine was synthesized (boiling point: 81 to 85° C./27 Pa, yield: 96%).

IR (thin film): ν=2953, 2839, 1740, 1437, 1255, 1200, 1176, 1119 cm$^1$. $^1$H-NMR (270 MHz in CDCl$_3$): δ=2.44 (4H, t, J=7.2 Hz), 2.63 (2H, t, J=6.1 Hz), 2.81 (4H, t, J=7.2 Hz), 3.31 (3H, s), 3.41 (2H, t, J=6.1 Hz), 3.64 (6H, s).

Syntheis Example 44

Synthesis of N-Butylbis[2-(methoxycarbonyl)ethyl]amine

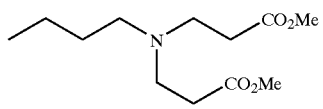

At 20 to 30° C., 12.9 g of methyl acrylate was added to 5.00 g of n-butylamine. The resulting mixture was allowed to stand for 20 hours, followed by concentration under reduced pressure, whereby 16.7 g of N-butylbis[2-(methoxycarbonyl)ethyl]amine was obtained (at a quantitative yield).

IR (thin film): ν=2954, 1740, 1437, 1254, 1198, 1174 cm$^{-1}$. $^1$H-NMR (300 MHz in CDCl$_3$): δ=0.87 (3H, t, J=7.2 Hz), 1.15–1.45 (4H, m), 2.37 (2H, t, J=7.4 Hz), 2.41 (4H, t, J=7.1 Hz), 2.73 (4H, t, J=7.1 Hz), 3.64 (6H, s).

Syntheis Example 45

Synthesis of N-Butylbis[2-(2-methoxyethoxycarbonyl)ethyl]amine

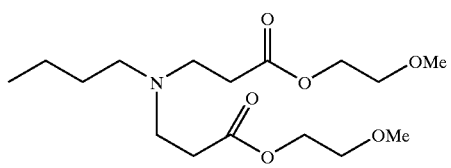

In a similar manner to Synthesis Example 44 except for the use of 2-methoxyethyl acrylate instead of methyl acrylate, N-butylbis[2-(2-methoxyethoxycarbonyl)ethyl]amine was synthesized (boiling point: 156° C./28 Pa, yield: 90%).

IR (thin film): ν=2956, 2931, 2875, 2819, 1736, 1456, 1375, 1252, 1182, 1130, 1036 cm$^{-1}$. $^1$H-NMR (300 MHz in CDCl$_3$): δ=0.86 (3H, t, J=7.2Hs), 1.15–1.45 (4H, m), 2.37 (2H, t, J=7.1 Hz), 2.46 (4H, t, J=7.4 Hz), 2.74 (4H, t, J=7.4H), 3.35 (6H, s), 3.56 (4H, m), 4.19 (4H, m).

Syntheis Example 46

Synthesis of N-Methylbis(2-acetoxyethyl)amine

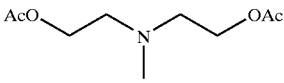

In a similar manner to Synthesis Example 2 except for the use of N-methyldiethanolamine instead of triethanolamine, N-methylbis(2-acetoxyethyl)amine was synthesized.

Syntheis Example 47

Synthesis of N-Ethylbis(2-acetoxyethyl)amine

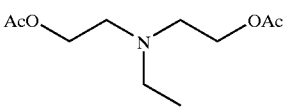

In a similar manner to Synthesis Example 2 except for the use of N-ethyldiethanolamine instead of triethanolamine, N-ethylbis(2-acetoxyethyl)amine was synthesized.

Syntheis Example 48

Synthesis of N-Methylbis(2-pivaloyloxyethyl)amine

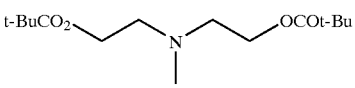

In a similar manner to Synthesis Example 7 except for the use of N-methyldiethanolamine instead of triethanolamine, N-methylbis(2-pivaloyloxyethyl)amine was synthesized.

Syntheis Example 49

Synthesis of N-Ethylbis[2-(methoxycarbonyloxy)ethyl]amine

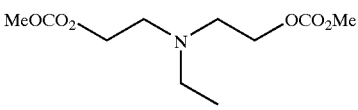

In a similar manner to Synthesis Example 9 except for the use of N-ethyldiethanolamine instead of triethanolamine, N-ethylbis[2-(methoxycarbonyloxy)ethyl]amine was synthesized.

Syntheis Example 50

Synthesis of N-Ethylbis[2-(tert-butoxycarbonyloxy)ethyl]amine

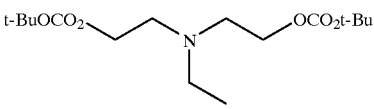

In a similar manner to Synthesis Example 10 except for the use of N-methyldiethanolamine instead of triethanolamine, N-ethylbis[2-(tert-butoxycarbonyloxy) ethyl]amine was synthesized.

Syntheis Example 51

Synthesis of tris(Methoxycarbonylmethyl)amine

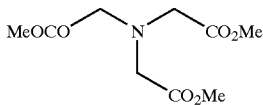

At 0 to 10° C., 29.4 g of methyl chloroacetate, and then 70 g of a saturated aqueous solution of potassium carbonate were added to a mixture of 5.00 g of 28% aqueous ammonia and 50 g of THF. The resulting mixture was stirred at room temperature for 20 hours. The reaction mixture was then extracted with diethyl ether, followed by washing with water, drying over anhydrous sodium sulfate and concentration under reduced pressure, whereby tris (methoxycarbonylmethyl)amine was obtained.

Syntheis Example 52

Synthesis of tris(Ethoxycarbonylmethyl)amine

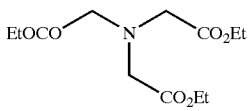

In a similar manner to Synthesis Example 51 except for the use of ethyl chloroacetate instead of methyl chloroacetate, tris(ethoxycarbonylmethyl)amine was synthesized.

Syntheis Example 53

Synthesis of N-Butylbis(methoxycarbonylmethyl) amine

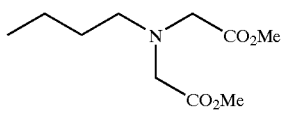

In a similar manner to Synthesis Example 51 except for the use of n-butylamine instead of aqueous ammonia, N-butylbis(methoxycarbonylmethyl)amine was synthesized.

Syntheis Example 54

Synthesis of N-Hexylbis(methoxycarbonylmethyl) amine

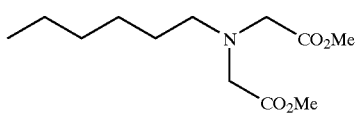

In a similar manner to Synthesis Example 51 except for the use of n-hexylamine instead of aqueous ammonia, N-hexylbis(methoxycarbonylmethyl)amine was synthesized.

Syntheis Example 55

Synthesis of β-(Diethylamino)-δ-valerolactone

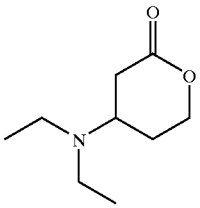

At 20 to 30° C., 4.00 g of diethylamine was added to 5.10 g of 5,6-dihydro-2H-pyran-2-one. The resulting mixture was allowed to stand for 20 hours, followed by concentration under reduced pressure, whereby β-(diethylamino)-δ-valerolactone was obtained.

Example 1

A resist solution was prepared byadding, at ratios as shown in the column of Example 1 of Table 1, the polymer, acid generator, base, dissolution inhibitor and crosslinker to 600 parts by weight of a 70:30 (weight ratio) mixed solvent of propylene glycol monomethyl ether acetate (PGMEA) and ethyl lactate (EL) to dissolve the former in the latter, followed by filtration through a 0.1-μm Teflon® filter.

Examples 2 to 63, Comparative Examples 1 to 12

In Examples 2 to 63, and Comparative Examples 1 to 12, resist solutions were prepared as in Example 1 under the conditions as shown in Tables 1 to 5. The structure of each of Amines 1 to 55 and the structure, weight-average molecular weight (Mw) and its ratio to the number-average molecular weight (Mn) of each of Polymers 1 to 8 will be shown later.

Evaluation of a Resist

In each of Examples 2 to 63 and Comparative Examples 1 to 12, a resist solution was prepared by adding the polymer, acid generator, base, dissolution inhibitor and crosslinker to a 70:30 (weight ratio) solvent mixture of propylene glycol monomethyl ether acetate (PGMEA) and ethyl lactate (EL) to dissolve the former in the latter, followed by filtration through a 0.1-μm Teflon® filter.

The resist solution thus obtained was applied by spin coating onto a silicon wafer which has thereover a film of DUV-30 (trade name; product of Nissan Chemical) in the thickness-of 55 nm and has a reflectance suppressed to 1% or less by a KrF light (248 nm). The resulting silicon wafer was baked on a hot plate at 100° C. for 90 seconds, whereby the thickness of the resist was adjusted to 550 nm.

The resulting resist was exposed to light of an excimer laser stepper ("NSR-S202A", product of Nikon K.K., NA-0.5, σ: 0.75, 2/3 zonal light) at varied exposures and focuses. Immediately after exposure, the resist was baked at 110° C. for 90 seconds and then developed for 60 seconds in a 2.38 wt % aqueous solution of tetramethylammonium hydroxide, whereby a pattern was formed.

The resist pattern thus formed was evaluated in the following manner.

Provided that the exposure quantity with which a 0.16-μm line-and-space pattern is resolved at 1:1 is the optimum exposure (Eop) which serves as an index of resist sensitivity, the "focus margin" at this time is determined. The definition for the focus margin is such that it is free from a decrease in the pattern film and its size falls within 0.16 μm±10%.

Results are shown in Tables 1 to 5.

TABLE 1

| Example | Polymer (part by weight) | Acid generator (part by weight) | Base (part by weight) | Dissolution inhibitor or crosslinker (part by weight) | Sensitivity (mJ/cm$^2$) | Focus margin ($\mu$m) |
|---|---|---|---|---|---|---|
| 1 | 1 (100) | PAG2 (2) | Amine 1 (0.1) | — | 30 | 0.8 |
| 2 | 1 (100) | PAG2 (2) | Amine 2 (0.1) | — | 35 | 0.9 |
| 3 | 1 (100) | PAG2 (2) | Amine 3 (0.1) | — | 31 | 1.0 |
| 4 | 1 (100) | PAG2 (2) | Amine 4 (0.12) | — | 30 | 1.0 |
| 5 | 1 (100) | PAG2 (2) | Amine 5 (0.12) | — | 33 | 1.0 |
| 6 | 1 (100) | PAG2 (2) | Amine 6 (0.12) | — | 28 | 1.0 |
| 7 | 1 (100) | PAG2 (2) | Amine 7 (0.1) | — | 32 | 1.0 |
| 8 | 1 (100) | PAG2 (2) | Amine 8 (0.12) | — | 39 | 1.0 |
| 9 | 1 (100) | PAG2 (2) | Amine 9 (0.16) | — | 38 | 1.0 |
| 10 | 1 (100) | PAG2 (2) | Amine 10 (0.16) | — | 36 | 1.0 |
| 11 | 2 (100) | PAG2 (2) | Amine 1 (0.1) | — | 35 | 0.6 |
| 12 | 3 (100) | PAG2 (2) | Amine 1 (0.1) | — | 31 | 1.1 |
| 13 | 4 (100) | PAG2 (2) | Amine 1 (0.1) | Crosslinker (15) | 38 | 0.8 |
| 14 | 5 (100) | PAG1 (2) | Amine 1 (0.1) | — | 33 | 0.8 |
| 15 | 6 (100) | PAG1 (2) | Amine 1 (0.1) | — | 46 | 1.0 |
| 16 | 7 (100) | PAG1 (2) | Amine 1 (0.1) | — | 48 | 1.0 |
| 17 | 8 (100) | PAG1 (2) | Amine 1 (0.1) | — | 42 | 1.0 |
| 18 | 2 (100) | PAG2 (2) | Amine 1 (0.1) | DRI (20) | 31 | 0.8 |

TABLE 2

| Example | Polymer (part by weight) | Acid generator (part by weight) | Base (part by weight) | Dissolution inhibitor or crosslinker (part by weight) | Sensitivity (mJ/cm$^2$) | Focus margin ($\mu$m) |
|---|---|---|---|---|---|---|
| 19 | 1 (100) | PAG2 (2) | Amine 11 (0.1) | — | 42 | 1.2 |
| 20 | 1 (100) | PAG2 (2) | Amine 12 (0.11) | — | 40 | 1.0 |
| 21 | 1 (100) | PAG2 (2) | Amine 13 (0.12) | — | 39 | 1.0 |
| 22 | 1 (100) | PAG2 (2) | Amine 14 (0.12) | — | 38 | 1.0 |
| 23 | 1 (100) | PAG2 (2) | Amine 15 (0.13) | — | 37 | 1.0 |
| 24 | 1 (100) | PAG2 (2) | Amine 16 (0.13) | — | 36 | 0.9 |
| 25 | 1 (100) | PAG2 (2) | Amine 17 (0.12) | — | 36 | 1.1 |
| 26 | 1 (100) | PAG2 (2) | Amine 18 (0.11) | — | 38 | 1.0 |
| 27 | 1 (100) | PAG2 (2) | Amine 19 (0.09) | — | 38 | 0.9 |
| 28 | 1 (100) | PAG2 (2) | Amine 20 (0.1) | — | 38 | 1.0 |
| 29 | 1 (100) | PAG2 (2) | Amine 21 (0.09) | — | 40 | 0.9 |

TABLE 2-continued

| Example | Polymer (part by weight) | Acid generator (part by weight) | Base (part by weight) | Dissolution inhibitor or crosslinker (part by weight) | Sensitivity (mJ/cm$^2$) | Focus margin ($\mu$m) |
|---|---|---|---|---|---|---|
| 30 | 1 (100) | PAG2 (2) | Amine 22 (0.12) | — | 38 | 1.0 |
| 31 | 1 (100) | PAG2 (2) | Amine 23 (0.1) | — | 40 | 0.9 |
| 32 | 1 (100) | PAG2 (2) | Amine 24 (0.12) | — | 38 | 1.0 |
| 33 | 1 (100) | PAG2 (2) | Amine 25 (0.1) | — | 37 | 0.9 |
| 34 | 1 (100) | PAG2 (2) | Amine 26 (0.12) | — | 36 | 1.2 |
| 35 | 1 (100) | PAG2 (2) | Amine 27 (0.13) | — | 34 | 1.0 |
| 36 | 1 (100) | PAG2 (2) | Amine 28 (0.12) | — | 36 | 1.1 |

TABLE 3

| Example | Polymer (part by weight) | Acid generator (part by weight) | Base (part by weight) | Dissolution inhibitor or crosslinker (part by weight) | Sensitivity (mJ/cm$^2$) | Focus margin ($\mu$m) |
|---|---|---|---|---|---|---|
| 37 | 1 (100) | PAG2 (2) | Amine 29 (0.12) | — | 37 | 1.0 |
| 38 | 1 (100) | PAG2 (2) | Amine 30 (0.16) | — | 40 | 1.0 |
| 39 | 1 (100) | PAG2 (2) | Amine 31 (0.11) | — | 36 | 0.9 |
| 40 | 1 (100) | PAG2 (2) | Amine 32 (0.13) | — | 40 | 1.0 |
| 41 | 1 (100) | PAG2 (2) | Amine 33 (0.11) | — | 37 | 0.9 |
| 42 | 1 (100) | PAG2 (2) | Amine 34 (0.14) | — | 39 | 1.0 |
| 43 | 1 (100) | PAG2 (2) | Amine 35 (0.1) | — | 34 | 0.9 |
| 44 | 1 (100) | PAG2 (2) | Amine 36 (0.12) | — | 35 | 1.1 |
| 45 | 1 (100) | PAG2 (2) | Amine 37 (0.1) | — | 40 | 1.2 |
| 46 | 1 (100) | PAG2 (2) | Amine 38 (0.1) | — | 41 | 1.0 |
| 47 | 1 (100) | PAG2 (2) | Amine 39 (0.1) | — | 38 | 1.0 |
| 48 | 1 (100) | PAG2 (2) | Amine 40 (0.1) | — | 38 | 1.0 |
| 49 | 1 (100) | PAG2 (2) | Amine 41 (0.11) | — | 41 | 1.0 |
| 50 | 1 (100) | PAG2 (2) | Amine 42 (0.1) | — | 40 | 1.0 |
| 51 | 1 (100) | PAG2 (2) | Amine 43 (0.1) | — | 38 | 1.0 |
| 52 | 1 (100) | PAG2 (2) | Amine 44 (0.1) | — | 37 | 1.0 |
| 53 | 1 (100) | PAG2 (2) | Amine 45 (0.1) | — | 37 | 0.9 |
| 54 | 1 (100) | PAG2 (2) | Amine 46 (0.12) | — | 38 | 0.9 |

TABLE 4

| Example | Polymer (part by weight) | Acid generator (part by weight) | Base (part by weight) | Dissolution inhibitor or crosslinker (part by weight) | Sensitivity (mJ/cm$^2$) | Focus margin ($\mu$m) |
|---|---|---|---|---|---|---|
| 55 | 1 (100) | PAG2 (2) | Amine 47 (0.09) | — | 34 | 0.9 |
| 56 | 1 (100) | PAG2 (2) | Amine 48 (0.11) | — | 35 | 0.8 |
| 57 | 1 (100) | PAG2 (2) | Amine 49 (0.11) | — | 34 | 0.9 |
| 58 | 1 (100) | PAG2 (2) | Amine 50 (0.12) | — | 36 | 0.8 |
| 59 | 1 (100) | PAG2 (2) | Amine 51 (0.12) | — | 34 | 0.8 |
| 60 | 1 (100) | PAG2 (2) | Amine 52 (0.1) | — | 40 | 1.0 |
| 61 | 1 (100) | PAG2 (2) | Amine 53 (0.11) | — | 39 | 1.0 |
| 62 | 1 (100) | PAG2 (2) | Amine 54 (0.1) | — | 40 | 0.9 |
| 63 | 1 (100) | PAG2 (2) | Amine 55 (0.11) | — | 40 | 0.9 |

TABLE 5

| Comparative Example | Polymer (part by weight) | Acid generator (part by weight) | Base (part by weight) | Dissolution inhibitor or crosslinker (part by weight) | Sensitivity (mJ/cm$^2$) | Focus margin ($\mu$m) |
|---|---|---|---|---|---|---|
| 1 | 1 (100) | PAG2 (2) | — | — | 5 | 0 |
| 2 | 1 (100) | PAG2 (2) | Proton sponge (0.2) | — | 30 | 0.4 |
| 3 | 1 (100) | PAG2 (2) | DBN (0.1) | — | 25 | 0.4 |
| 4 | 1 (100) | PAG2 (2) | DBU (0.1) | — | 28 | 0.5 |
| 5 | 2 (100) | PAG2 (2) | DBN (0.1) | — | 35 | 0.2 |
| 6 | 3 (100) | PAG2 (2) | DBN (0.1) | — | 31 | 0.5 |
| 7 | 4 (100) | PAG2 (2) | DBN (0.1) | Crosslinker (15) | 38 | 0.3 |
| 8 | 5 (100) | PAG1 (2) | DBN (0.1) | — | 33 | 0.3 |
| 9 | 6 (100) | PAG1 (2) | DBN (0.1) | — | 46 | 0.6 |
| 10 | 7 (100) | PAG1 (2) | DBN (0.1) | — | 48 | 0.6 |
| 11 | 8 (100) | PAG1 (2) | DBN (0.1) | — | 42 | 0.6 |
| 12 | 2 (100) | PAG2 (2) | DBN (0.1) | DRI (20) | 31 | 0.4 |

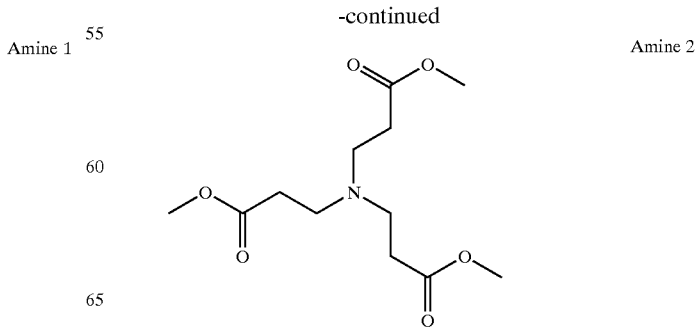

Amine 1

-continued

Amine 2

Amine 3
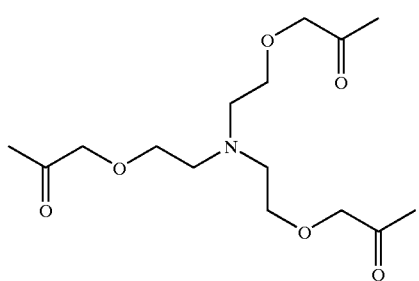
Amine 8
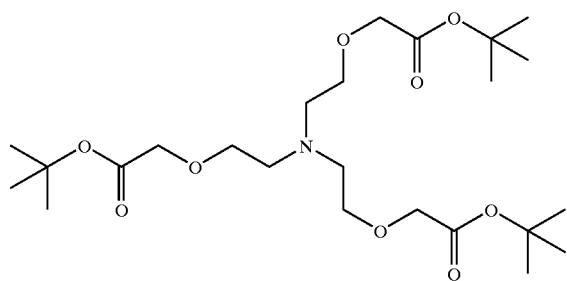
Amine 4
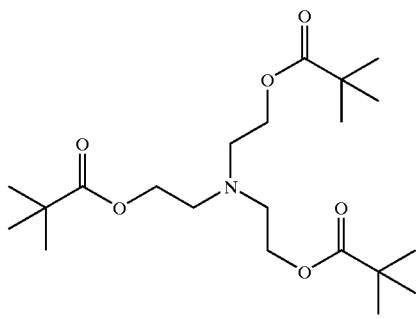
Amine 9
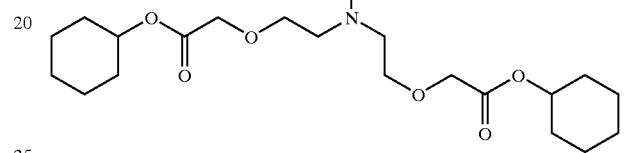
Amine 5
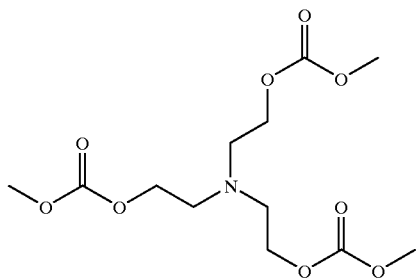
Amine 10
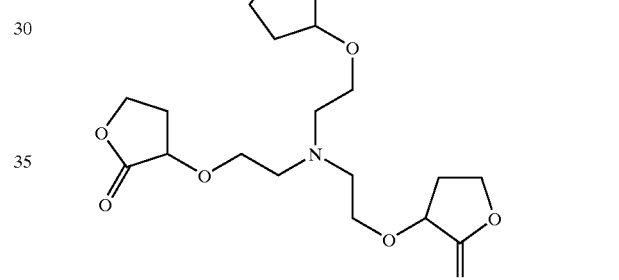
Amine 6
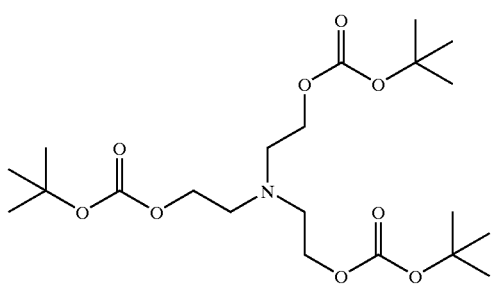
Amine 11
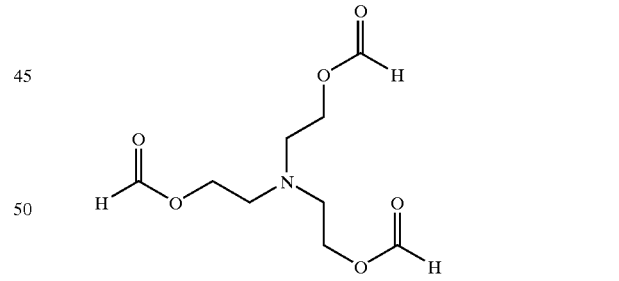
Amine 7
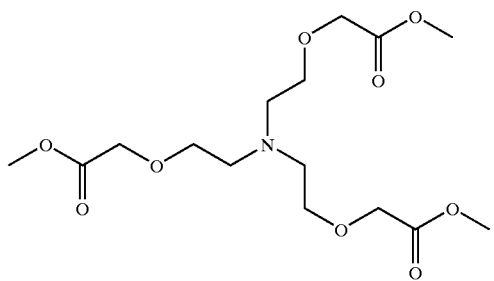
Amine 12
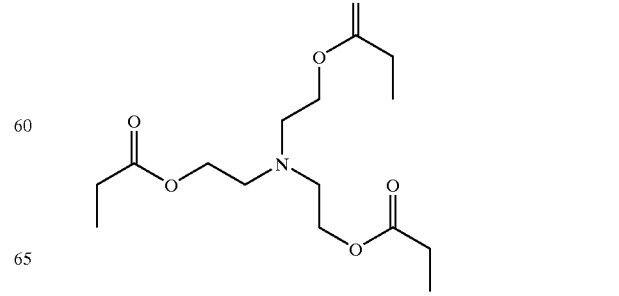

Amine 13
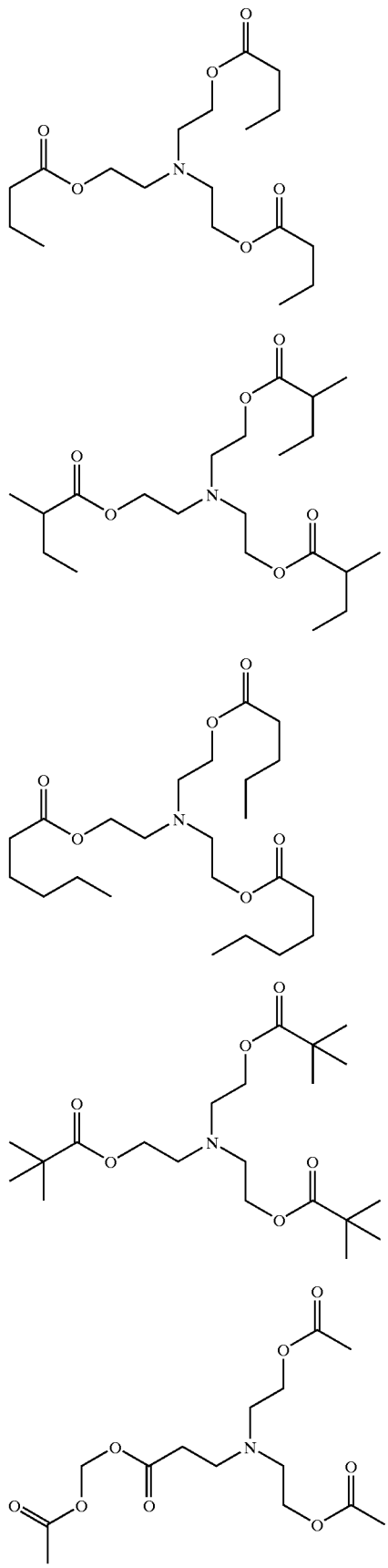
Amine 14
Amine 15
Amine 16
Amine 17
Amine 18
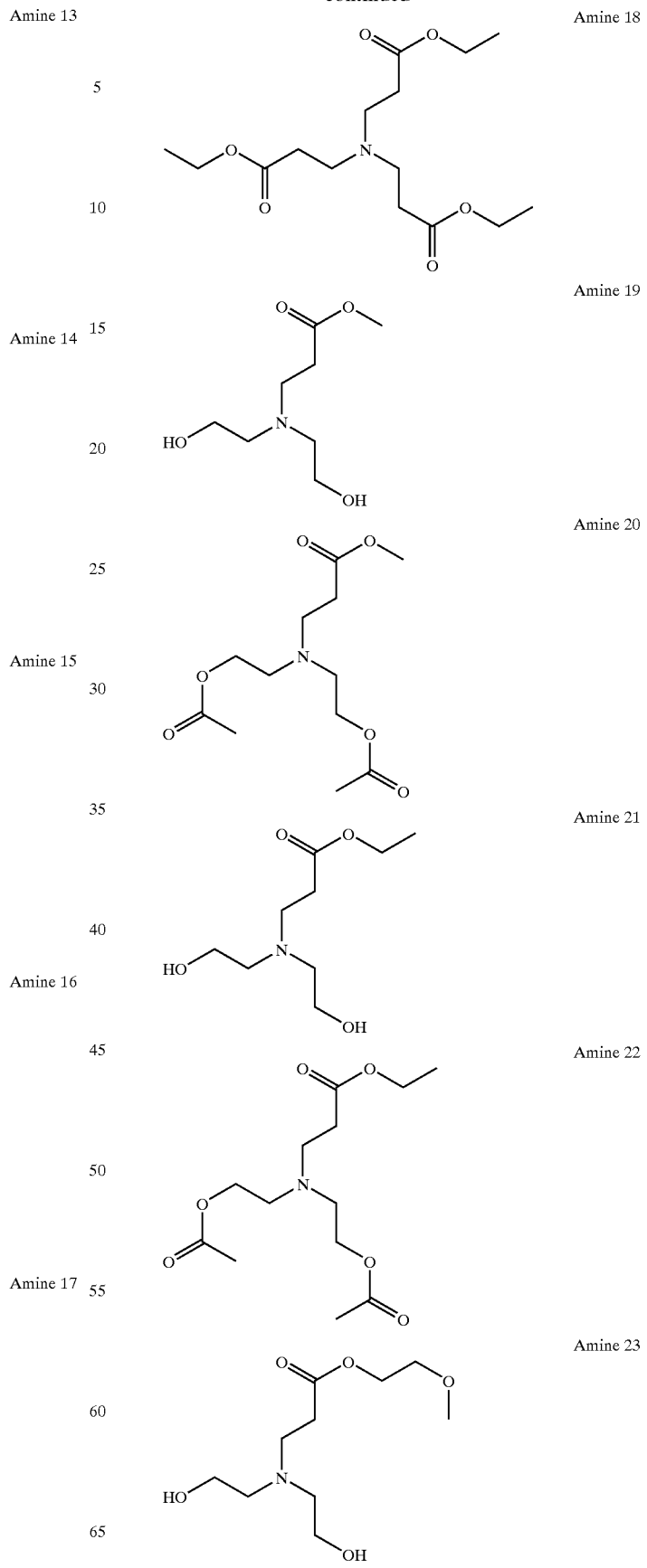
Amine 19
Amine 20
Amine 21
Amine 22
Amine 23

Amine 24
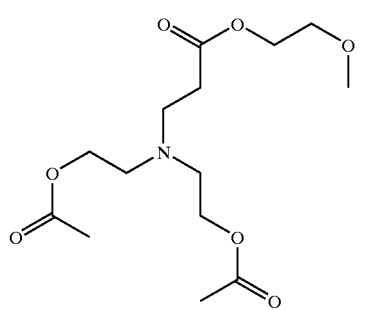
Amine 25
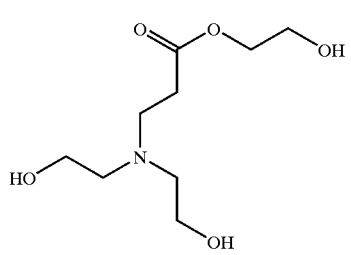
Amine 26
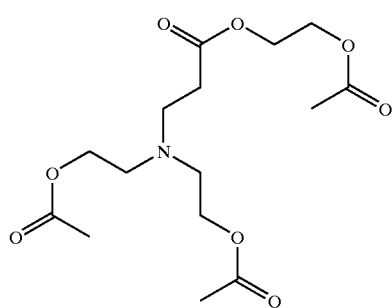
Amine 27
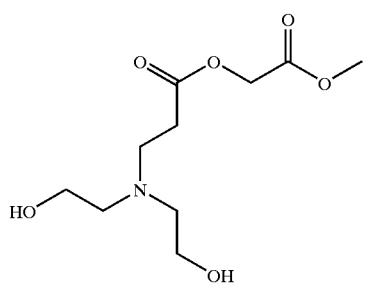
Amine 28
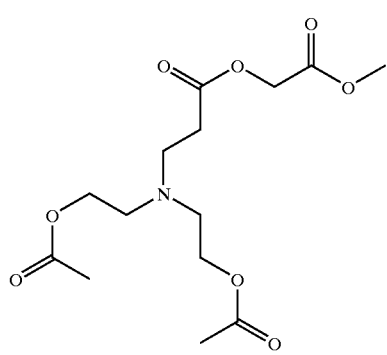
Amine 29
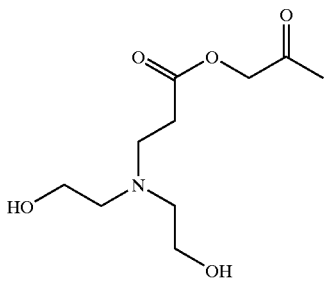
Amine 30
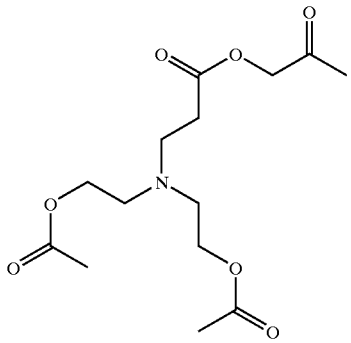
Amine 31
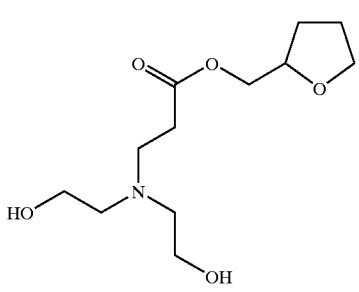
Amine 32
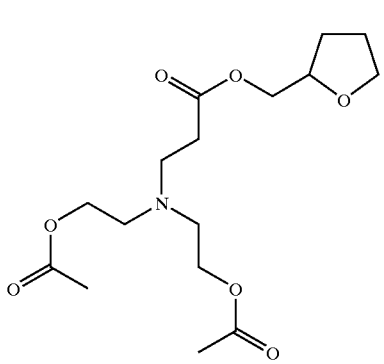
Amine 33
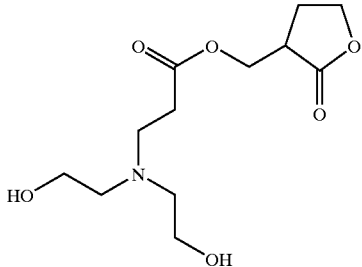

Amine 34
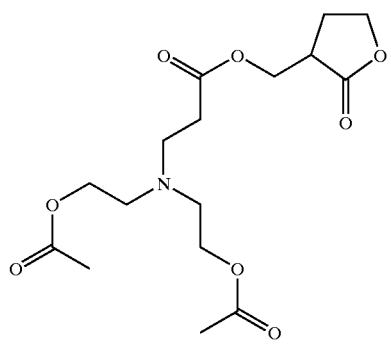
Amine 35
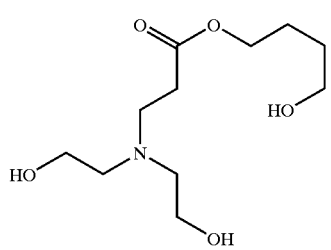
Amine 36
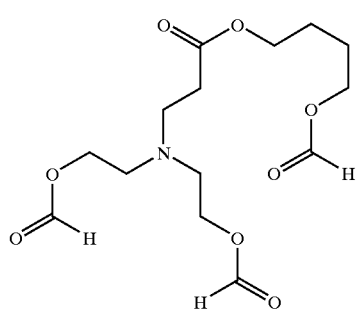
Amine 37
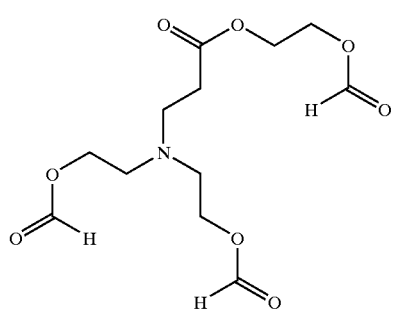
Amine 38
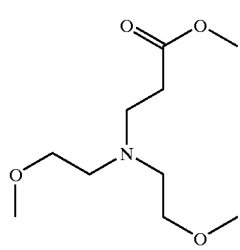
Amine 39
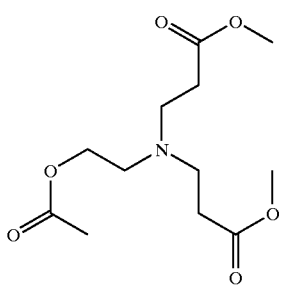
Amine 40
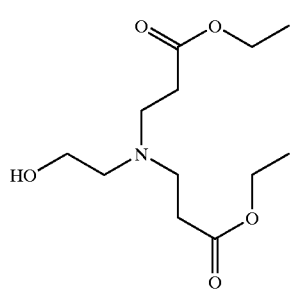
Amine 41
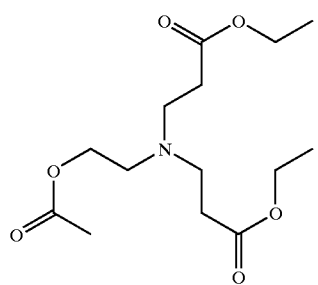
Amine 42
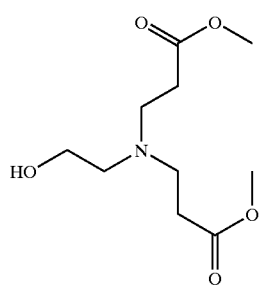
Amine 43
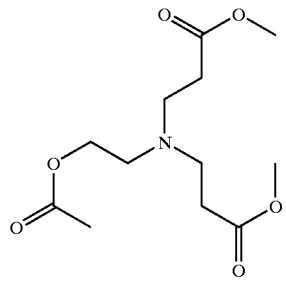

Amine 44
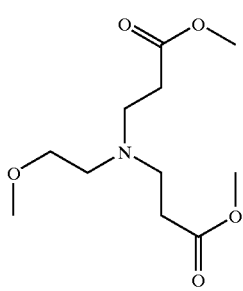
Amine 45
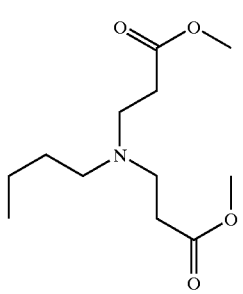
Amine 46
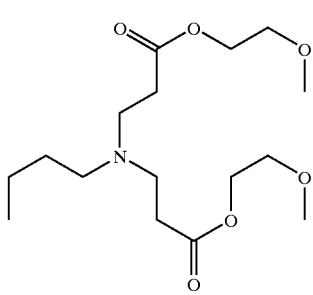
Amine 47
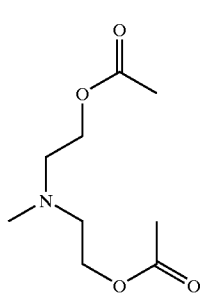
Amine 48
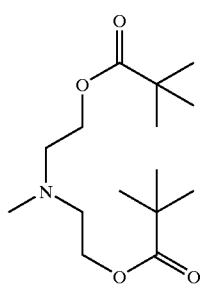
Amine 49
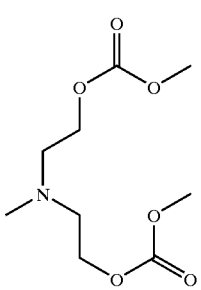
Amine 50
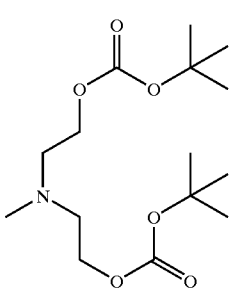
Amine 51
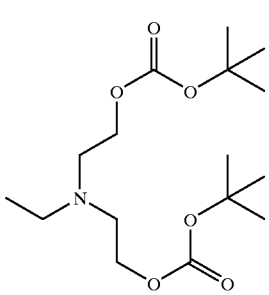
Amine 52
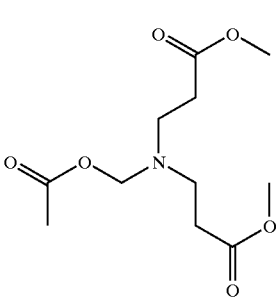
Amine 53
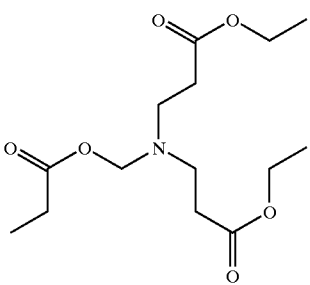

Amine 54
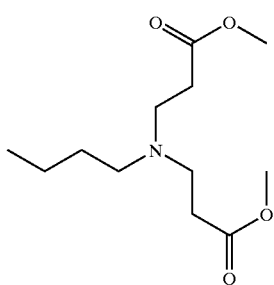
Amine 55
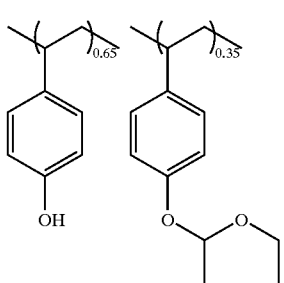
Polymer1
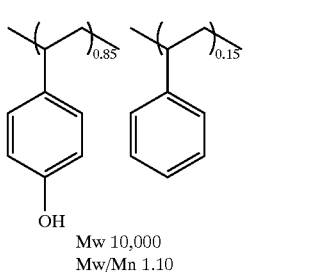
Mw 10,000
Mw/Mn 1.10
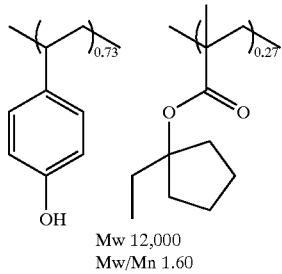
Mw 10,000
Mw/Mn 1.10
Polymer2
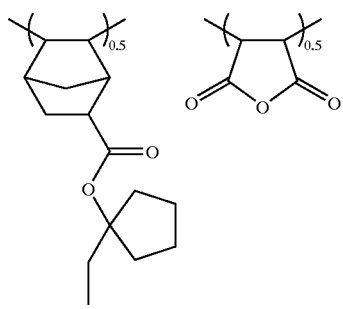
Mw 10,000
Mw/Mn 1.10
Polymer5
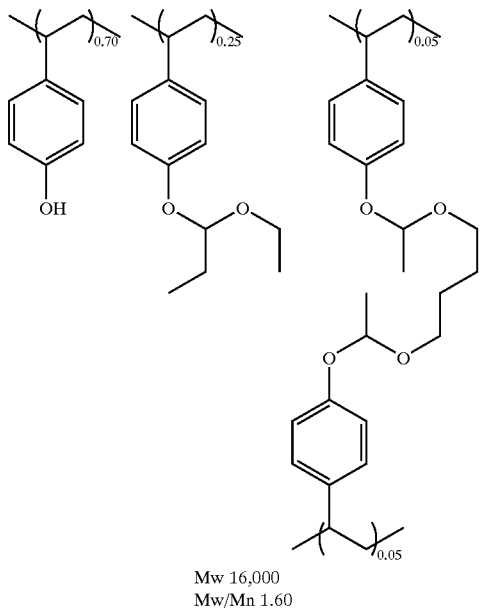
Mw 12,000
Mw/Mn 1.60
Polymer3
Mw 16,000
Mw/Mn 1.60
Polymer4
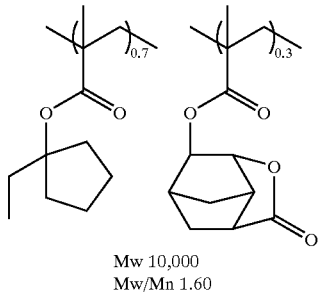
Mw 10,000
Mw/Mn 1.60
Polymer6
Polymer 7
Mw 10,000
Mw/Mn 1.50

Polymer 8

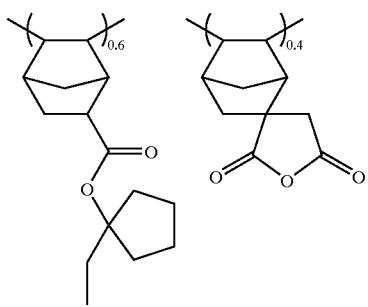

Mw 18,000
Mw/Mn 2.0

PAG1

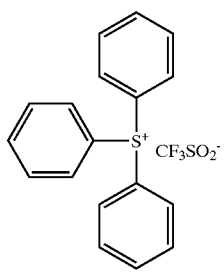

PAG2

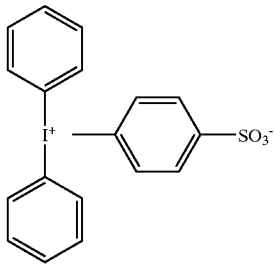

DRI 1

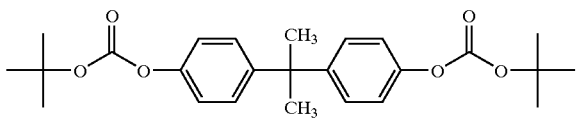

Crosslinker 1

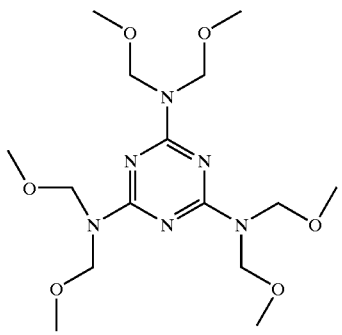

What is claimed is:

1. A resist composition comprising:
one or more basic compounds selected from those represented by the following formula (I):

$$N(X)_n(Y)_{3-n} \qquad (I)$$

wherein, n stands for 1, 2 or 3; side chains Xs are the same or different and each independently represents $-R^1-O-R^2$ or $-R^1-C(=O)-O-R^{61}$, in which $R^1$s are the same or different and each independently represents an alkylene group of 1 to 5 carbon atoms, $R^2$s are the same or different and each independently represents a linear, branched or cyclic alkyl group of 1 to 20 carbon atoms containing a carbonyl or an ester group, and $R^{61}$s are the same or different and each independently represents a linear, branched or cyclic alkyl group of 1 to 20 carbon atoms which may contain a carbonyl group, an ester group, an ether group, a hydroxyl group or a lactone ring, or $R^1$ and $R^2$, or $R^1$ and $R^{61}$ in the same side chain may be coupled together to form a ring; and side chains Ys are the same or different and each independently represents a hydrogen atom or a linear, branched or cyclic alkyl group of 1 to 20 carbon atoms which may contain an ether or hydroxyl group;

an organic solvent;

a base resin which is an alkali insoluble or sparingly-soluble resin having an acidic functional group protected with an acid-labile group but becomes alkali soluble upon elimination of said acid-labile group; and an acid generator, said resist composition being a positive type resist composition.

2. A resist composition according to claim 1, further comprising a dissolution inhibitor.

3. A resist composition comprising:
one or more basic compounds selected from those represented by the following formulas (1) to (4):

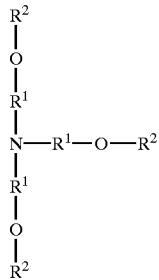

(1)

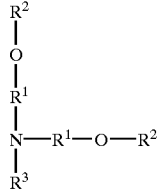

(2)

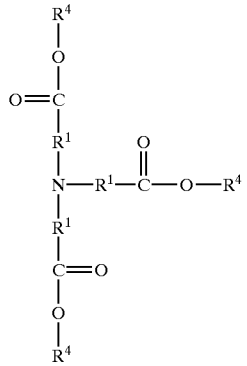

(3)

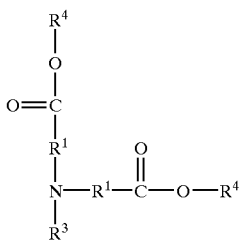
(4)

wherein, $R^1$ are the same or different and each independently represents a $C_{1-5}$ alkylene group, $R^2$s are the same or different and each independently represents a linear, branched or cyclic alkyl group of 1 to 20 carbon atoms containing a carbonyl group or an ester group, $R^3$ represents a hydrogen atom or a linear, branched or cyclic alkyl group of 1 to 20 carbon atoms which may contain a hydroxyl or ether group, and $R^4$s are the same or different and each independently represents a linear, branched or cyclic alkyl group of 1 to 20 carbon atoms which may contain a carbonyl, ester or ether group;

an organic solvent;

a base resin which is an alkali insoluble or sparingly-soluble resin having an acidic functional group protected with an acid-labile group but becomes alkali soluble upon elimination of said acid-labile group; and an acid generator, said resist composition being a positive type resist composition.

4. A resist composition according to claim 3, further comprising a dissolution inhibitor.

5. A resist composition comprising:

one or more basic compounds selected from those represented by the following formula (III):

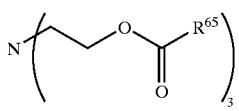
(III)

wherein $R^{65}$s are the same or different and each independently represents a hydrogen atom or a linear, branched or cyclic alkyl group of 1 to 15 carbon atoms which may contain an ether, carbonyl, ester or hydroxyl group;

an organic solvent;

a base resin which is an alkali insoluble or sparingly-soluble resin having an acidic functional group protected with an acid-labile group but becomes alkali soluble upon elimination of said acid-labile group; and an acid generator, said resist composition being a positive type resist composition.

6. A resist composition according to claim 5, further comprising a dissolution inhibitor.

7. A resist composition comprising:

one or more basic compounds selected from those represented by the following formula (I):

$$N(X)_n(Y)_{3-n} \quad (I)$$

wherein, n stands for 1, 2 or 3; side chains Xs are the same or different and each independently represents —$R^1$—O—$R^2$ or —$R^1$—C(=O)—O—$R^{61}$, in which $R^1$s are the same or different and each independently represents an alkylene group of 1 to 5 carbon atoms, $R^2$s are the same or different and each independently represents a linear, branched or cyclic alkyl group of 1 to 20 carbon atoms containing a carbonyl or ester group, and $R^{61}$s are the same or different and each independently represents a linear, branched or cyclic alkyl group of 1 to 20 carbon atoms which may contain a carbonyl group, an ester group, an ether group, a hydroxyl group or a lactone ring, or $R^1$ and $R^2$, or $R^1$ and $R^{61}$ in the same side chain may be coupled together to form a ring; and side chains Ys are the same or different and each independently represents a hydrogen atom or a linear, branched or cyclic alkyl group of 1 to 20 carbon atoms which may contain an ether or hydroxyl group;

an organic solvent;

a base resin which is an alkali soluble resin but becomes sparingly soluble in alkali by crosslinking with a crosslinker;

an acid generator; and said crosslinker which crosslinks in the presence of an acid, said resist composition being a negative type resist composition.

8. A resist composition comprising:

one or more basic compounds selected from those represented by the following formulas (1) to (4):

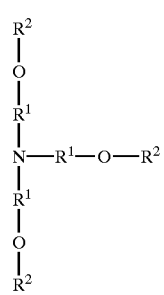
(1)

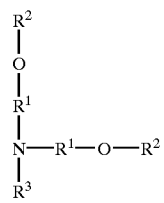
(2)

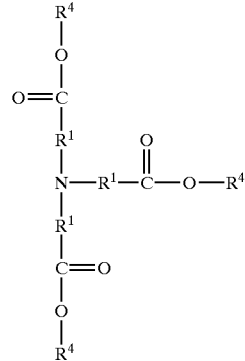
(3)

-continued

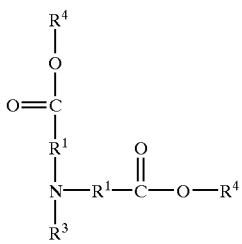
(4)

wherein, $R^1$s are the same or different and each independently represents a $C_{1-5}$ alkylene group, $R^2$s are the same or different and each independently represents a linear, branched or cyclic alkyl group of 1 to 20 carbon atoms containing a carbonyl group or an ester group, $R^3$ represents a hydrogen atom or a linear, branched or cyclic alkyl group of 1 to 20 carbon atoms which may contain a hydroxyl or ether group, and $R^4$s are the same or different and each independently represents a linear, branched or cyclic alkyl group of 1 to 20 carbon atoms which may contain a carbonyl, ester or ether group;

an organic solvent;

a base resin which is an alkali soluble resin but becomes sparingly soluble in alkali by crosslinking with a crosslinker;

an acid generator; and said crosslinker which crosslinks in the presence of an acid, said resist composition being a negative type resist composition.

9. A resist composition comprising:

one or more basic compounds selected from those represented by the following formula (III):

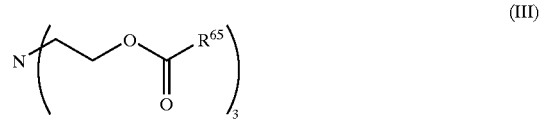
(III)

wherein $R^{65}$s are the same or different and each independently represents a hydrogen atom or a linear, branched or cyclic alkyl group of 1 to 15 carbon atoms which may contain an ether, carbonyl, ester or hydroxyl group;

an organic solvent;

a base resin which is an alkali soluble resin but becomes sparingly soluble in alkali by crosslinking with a crosslinker;

an acid generator; and said crosslinker which crosslinks in the presence of an acid, said resist composition being a negative type resist composition.

* * * * *